US012757532B2

(12) United States Patent
Kang et al.

(10) Patent No.: US 12,757,532 B2
(45) Date of Patent: Oct. 6, 2026

(54) DISPLAY DEVICE AND METHOD FOR MANUFACTURING THE SAME

(71) Applicant: LG Display Co., Ltd., Seoul (KR)

(72) Inventors: Minjae Kang, Seoul (KR); Dongseok Lee, Bucheon-si (KR); Jusang Rhim, Seoul (KR); Sunghwan Yoon, Seoul (KR); Yuseop Shin, Bucheon-si (KR); Rokhee Lee, Seoul (KR)

(73) Assignee: LG Display Co., Ltd., Seoul (KR)

( * ) Notice: Subject to any disclaimer, the term of this patent is extended or adjusted under 35 U.S.C. 154(b) by 490 days.

(21) Appl. No.: 18/221,984

(22) Filed: Jul. 14, 2023

(65) Prior Publication Data

US 2024/0258465 A1 Aug. 1, 2024

(30) Foreign Application Priority Data

Feb. 1, 2023 (KR) ........................ 10-2023-0013592

(51) Int. Cl.

| | |
|---|---|
| ***H01L 33/40*** | (2010.01) |
| ***G09G 3/32*** | (2016.01) |
| ***H10H 20/832*** | (2025.01) |
| ***H10H 20/85*** | (2025.01) |
| ***H10H 20/857*** | (2025.01) |
| ***H10W 90/00*** | (2026.01) |
| *H10H 20/01* | (2025.01) |
| *H10H 20/819* | (2025.01) |

(Continued)

(52) U.S. Cl.

CPC ............. *H10H 20/832* (2025.01); *G09G 3/32* (2013.01); *H10H 20/8506* (2025.01); *H10H 20/857* (2025.01); *H10W 90/00* (2026.01); *G09G 2300/0842* (2013.01); *H10H 20/0364* (2025.01); *H10H 20/819* (2025.01); *H10W 70/60* (2026.01); *H10W 90/22* (2026.01)

(58) Field of Classification Search

CPC ............. H10H 20/832; H10H 20/8506; H10H 20/018; H10H 29/142; H10H 20/83; G09G 3/32; H10W 90/22; H10P 72/50; H10D 86/411; H10D 86/441; H10D 86/451; H10D 86/481

See application file for complete search history.

(56) References Cited

U.S. PATENT DOCUMENTS

| | | | | |
|---|---|---|---|---|
| 2020/0303592 | A1 | 9/2020 | Kim et al. | |
| 2022/0093678 | A1 | 3/2022 | Lee et al. | |
| 2022/0352268 | A1 * | 11/2022 | Seo | H01L 25/0753 |

FOREIGN PATENT DOCUMENTS

| | | | |
|---|---|---|---|
| CN | 113066801 | A | 7/2021 |
| KR | 10-2102818 | B1 | 4/2020 |

* cited by examiner

*Primary Examiner* — Elmito Breval

(74) *Attorney, Agent, or Firm* — PnK IP LLC

(57) ABSTRACT

A display device includes a base substrate including a display area and a circuit area; a planarization layer disposed on the base substrate; a plurality of debossing grooves defined in the planarization layer and disposed on the display area of the base substrate; at least one light-emitting element aligned with and received in each of the debossing grooves, wherein the light-emitting element includes a first semiconductor layer, an active layer, a second semiconductor layer, and a first electrode contacting the first semiconductor layer; a second electrode line contacting the second semiconductor layer of the light-emitting element; and a first electrode line electrically connected to the first electrode.

14 Claims, 28 Drawing Sheets

(51) Int. Cl.

| | |
|---|---|
| *H10W 70/60* | (2026.01) |
| *H10W 90/22* | (2026.01) |

DISPLAY DEVICE AND METHOD FOR MANUFACTURING THE SAME

CROSS-REFERENCE TO RELATED APPLICATION

This application claims the priority of Korean Patent Application No. 10-2023-0013592 filed on Feb. 1, 2023, which is hereby incorporated by reference its entirety.

BACKGROUND

Field of the Disclosure

The present disclosure relates to a display device including a light-emitting element, for example, a micro light-emitting element such as nanorod light-emitting element, and a method for manufacturing the same.

Description of the Background

A display device is applied to various electronic devices such as TVs, mobile phones, laptops and tablets. To this end, research to develop thinning, lightening, and low power consumption of the display device is continuing.

Among display devices, a light-emitting display device has a light-emitting element or a light source built therein and displays information using light generated from the built-in light-emitting element or light source. A display device including a self-light-emitting element may be implemented to be thinner than a display device with the built-in light source, and may be implemented as a flexible display device that may be folded, bent, or rolled.

The display device having the self-light-emitting element may include, for example, an organic light-emitting display device (OLED) including a light-emitting layer made of an organic material, or a micro LED display device (micro light-emitting diode display device) including a light-emitting layer made of an inorganic material. In this regard, the organic light-emitting display device does not require a separate light source. However, due to material characteristics of the organic material that is vulnerable to moisture and oxygen, a defective pixel easily occurs in the organic light-emitting display device due to an external environment. On the contrary, the micro LED display device includes the light-emitting layer made of the inorganic material that is resistant to moisture and oxygen and thus is not affected by the external environment and thus has higher reliability and has a longer lifespan compared to the organic light-emitting display device.

SUMMARY

The present disclosure is to provide a display device including a light-emitting element (for example, a micro light-emitting element such as a nanorod light-emitting element) having an electrode disposed only at one of both opposing ends. For example, the electrode may be made of a magnetic material.

The present disclosure is also to provide a display device in which at least one light-emitting element (for example, a micro light-emitting element such a nanorod light-emitting element) having only one electrode at one of both opposing ends is aligned with and received in a debossing groove, thereby improving luminance of the display device. For example, the electrode may be made of a magnetic material.

The present disclosure is not limited to the above-mentioned features and other features and advantages according to the present disclosure that are not mentioned may be understood based on following descriptions, and may be more clearly understood based on aspects according to the present disclosure. Further, it will be easily understood that the purposes and advantages according to the present disclosure may be realized using means shown in the claims or combinations thereof.

In an aspect of the present disclosure, a display device includes a base substrate including a display area and a circuit area: a planarization layer disposed on the base substrate: a plurality of debossing grooves defined in the planarization layer and disposed on the display area of the base substrate: at least one light-emitting element aligned with and received in the plurality of debossing grooves, respectively, wherein the light-emitting element includes a first semiconductor layer, an active layer, a second semiconductor layer, and a first electrode contacting the first semiconductor layer: a second electrode line electrically connected to the second semiconductor layer of the light-emitting element; and a first electrode line electrically connected to the first electrode of the light-emitting element.

In one implementation, an insulating layer disposed between the first electrode line and the second electrode line may be further comprised.

In one implementation, the second electrode line covers a top surface of the planarization layer between the adjacent debossing grooves and a part of a side surface of at least one of the debossing grooves while contacting the second semiconductor layer.

In one implementation, the first electrode line covers the planarization layer while being contact to the first electrode of the light-emitting element.

In one implementation, the first electrode of the light-emitting element aligned with and received in the debossing groove includes a magnetic material.

In one implementation, a multi-layer insulating structure is disposed under the plurality of debossing grooves and is disposed on the display area.

In one implementation, the light-emitting element disposed in the debossing grooves includes a nanorod shape.

In one implementation, the debossing groove includes a flat bottom surface and an inclined side surface inclined relative to the bottom surface.

In one implementation, the debossing groove includes a flat bottom surface, a protrusion protruding from the bottom surface, and an inclined side surface inclined relative to the bottom surface.

In one implementation, the protrusion has an outer surface area smaller than a cross-sectional area of the light-emitting element in a diameter direction, wherein the protrusion has an inclined side surface.

In one implementation, a length of the inclined side surface of the protrusion is smaller than or equal to a length of the light-emitting element.

In one implementation, the first electrode of each of a plurality of light-emitting elements is in contact with the bottom surface of a corresponding debossing groove.

In one implementation, a driving transistor and a storage capacitor for driving the light-emitting element are disposed in the circuit area.

In one implementation, at least one of the first electrode line and the second electrode line includes a transparent metal oxide including indium-tin-oxide (ITO) or indium-zinc-oxide (IZO).

In another aspect of the present disclosure, a display device includes a base substrate including a display area and a circuit area: a planarization layer disposed on the base substrate: a plurality of debossing grooves defined in the planarization layer and disposed on the display area of the base substrate: at least one light-emitting element aligned with and received in each of the debossing grooves, wherein the light-emitting element includes a first semiconductor layer, an active layer, a second semiconductor layer, and a first electrode contacting the first semiconductor layer: a second electrode line disposed on a portion of the planarization layer disposed between adjacent ones of the plurality of debossing grooves, wherein the second electrode line contacts the second semiconductor layer of the light-emitting element; and a first electrode line covering an insulating layer covering the second electrode line and the light-emitting elements, wherein the first electrode line is electrically connected to the first electrode.

In yet another aspect of the present disclosure, a method for manufacturing a display device includes forming a planarization layer on a base substrate including a display area and a circuit area: forming a plurality of debossing grooves in a portion of the planarization layer disposed on the display area: supplying fluid including a plurality of light-emitting elements on the planarization layer, wherein each of the plurality light-emitting elements includes a first semiconductor layer, an active layer, a second semiconductor layer, and a first electrode contacting the first semiconductor layer and being made of magnetic material: aligning the plurality light-emitting elements with the plurality of debossing grooves, respectively, through a magnetic field, such that the plurality light-emitting elements are received in the plurality of debossing grooves, respectively: forming a second electrode line on a portion of the planarization layer in which the plurality of debossing grooves are defined, the second electrode line electrically connected to the second semiconductor layer; and forming a first electrode line on the second electrode line, the first electrode line electrically connected to the first electrode.

According to one aspect of the present disclosure, the debossing groove may be introduced into the display device, thereby easily aligning the light-emitting element, for example, a micro light-emitting element such as nanorod-shaped light-emitting element.

Further, the debossing groove structure including the protrusion on the bottom surface thereof may be formed such that the plurality of light-emitting elements may be received in the debossing groove structure, thereby further improving luminance of the display device and thus driving the display device at a low power level and thus reducing the power consumption.

Further, for example, a light-emitting element (for example, a micro light-emitting element such as a nanorod light-emitting element) has an electrode disposed only at one of both opposing ends and made of a magnetic material. For example, the light-emitting element is oriented such that the electrode made of the magnetic material contacts the bottom surface of the debossing groove structure. Thus, the defect that light emission does not occur due to the alignment of the electrode of the light-emitting element and the pad electrode having opposite polarities with each other may be prevented.

Effects of the present disclosure are not limited to the effects mentioned above, and other effects not mentioned will be clearly understood by those skilled in the art from the descriptions below.

BRIEF DESCRIPTION OF THE DRAWINGS

The accompanying drawings, which are included to provide a further understanding of the disclosure and are incorporated in and constitute a part of the disclosure, illustrate aspects of the disclosure and together with the description serve to explain the principle of the disclosure.

In the drawings.

DETAILED DESCRIPTION

Figure 1:
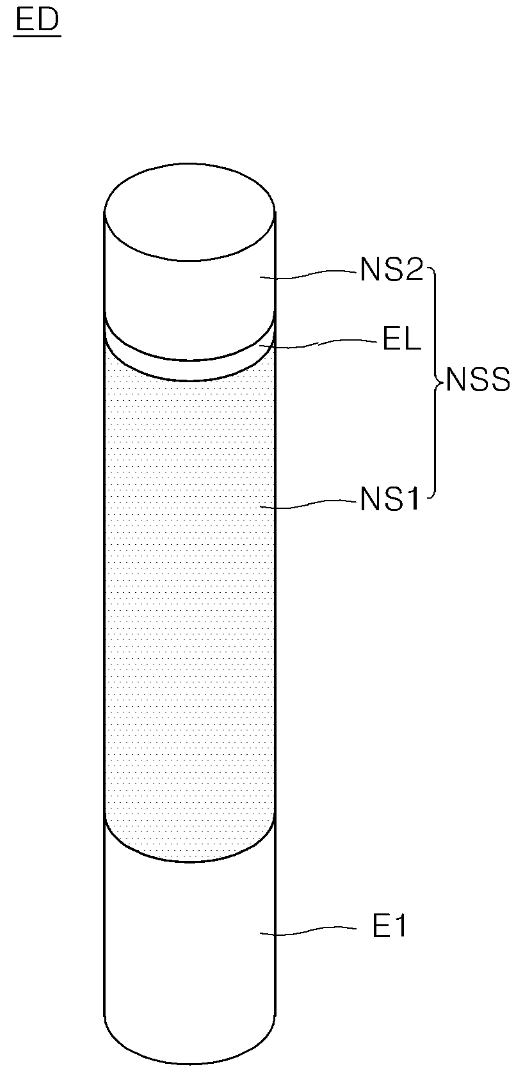
FIG. 1 is a perspective view of a light-emitting element according to an aspect of the present disclosure.

Advantages and features of the present disclosure, and a method of achieving the advantages and features will become apparent with reference to aspects described later in detail together with the accompanying drawings. However, the present disclosure is not limited to the aspects as disclosed below, but may be implemented in various different forms. Thus, these aspects are set forth only to make the present disclosure complete, and to completely inform the scope of the present disclosure to those of ordinary skill in the technical field to which the present disclosure belongs.

A shape, a size, a ratio, an angle, a number, etc. disclosed in the drawings for describing the aspects of the present disclosure are exemplary, and the present disclosure is not limited thereto. The same reference numerals refer to the same elements herein. Further, descriptions and details of well-known steps and elements are omitted for simplicity of the description. Furthermore, in the following detailed description of the present disclosure, numerous specific details are set forth to provide a thorough understanding of the present disclosure. However, it will be understood that the present disclosure may be practiced without these specific details. In other instances, well-known methods, procedures, components, and circuits have not been described in detail so as not to unnecessarily obscure aspects of the present disclosure.

The terminology used herein is directed to the purpose of describing particular aspects only and is not intended to be limiting of the present disclosure. As used herein, the singular constitutes "a" and "an" are intended to include the plural constitutes as well, unless the context clearly indicates otherwise. It will be further understood that the terms "comprise", "including", "include", and "including" when used in this specification, specify the presence of the stated features, integers, operations, elements, and/or components, but do not preclude the presence or addition of one or more other features, integers, operations, elements, components, and/or portions thereof. As used herein, the term "and/or" includes any and all combinations of one or more of the associated listed items. Expression such as "at least one of" when preceding a list of elements may modify the entire list of elements and may not modify the individual elements of the list. In interpretation of numerical values, an error or tolerance therein may occur even when there is no explicit description thereof.

In addition, it will also be understood that when a first element or layer is referred to as being present "on" a second element or layer, the first element or layer may be disposed directly on the second element or layer or may be disposed indirectly on the second element or layer with a third element or layer being disposed between the first and second elements or layers. It will be understood that when an element or layer is referred to as being "connected to", or "coupled to" another element or layer, it may be directly connected to, or coupled to the other element or layer, or one or more intervening elements or layers may be present. In addition, it will also be understood that when an element or layer is referred to as being "between" two elements or layers, it may be the only element or layer between the two elements or layers, or one or more intervening elements or layers may also be present.

Further, as used herein, when a layer, film, region, plate, or the like may be disposed "on" or "on a top" of another layer, film, region, plate, or the like, the former may directly contact the latter or still another layer, film, region, plate, or the like may be disposed between the former and the latter. As used herein, when a layer, film, region, plate, or the like is directly disposed "on" or "on a top" of another layer, film, region, plate, or the like, the former directly contacts the latter and still another layer, film, region, plate, or the like is not disposed between the former and the latter. Further, as used herein, when a layer, film, region, plate, or the like may be disposed "below" or "under" another layer, film, region, plate, or the like, the former may directly contact the latter or still another layer, film, region, plate, or the like may be disposed between the former and the latter. As used herein, when a layer, film, region, plate, or the like is directly disposed "below" or "under" another layer, film, region, plate, or the like, the former directly contacts the latter and still another layer, film, region, plate, or the like is not disposed between the former and the latter.

In descriptions of temporal relationships, for example, temporal precedent relationships between two events such as "after", "subsequent to", "before", etc., another event may occur therebetween unless "directly after", "directly subsequent" or "directly before" is indicated.

It will be understood that, although the terms "first", "second", "third", and so on may be used herein to describe various elements, components, regions, layers and/or sections, these elements, components, regions, layers and/or sections should not be limited by these terms. These terms are used to distinguish one element, component, region, layer or section from another element, component, region, layer or section. Thus, a first element, component, region, layer or section described below could be termed a second element, component, region, layer or section, without departing from the spirit and scope of the present disclosure.

The features of the various aspects of the present disclosure may be partially or entirely combined with each other, and may be technically associated with each other or operate with each other. The aspects may be implemented independently of each other and may be implemented together in an association relationship.

Unless otherwise defined, all terms including technical and scientific terms used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Hereinafter, a display device according to each aspect of the present disclosure will be described with reference to the accompanying drawings.

FIG. 1 is a perspective view of a light-emitting element according to one aspect of the present disclosure.

Referring to FIG. 1, a light-emitting element ED according to one aspect of the present disclosure may include a nitride semiconductor structure NSS and a first electrode E1 disposed on one end face of the nitride semiconductor structure NSS. The nitride semiconductor structure NSS may include a structure in which a first semiconductor layer NS1, an active layer EL, and a second semiconductor layer NS2 are stacked. The light-emitting element ED may have a nanorod shape such as a cylinder, but not limited thereto. The light-emitting element ED having the nanorod shape may have a length of, for example, 3 μm to 10 μm, and a diameter of, for example, 100 nm to 1 μm. For example, the light-emitting element ED may be another type of micro light-emitting element, but not limited thereto.

The first semiconductor layer NS1 may be a layer for supplying electrons to the active layer EL, and may include a nitride-based semiconductor containing first conductivity type impurities. For example, the first conductivity-type impurity may include an N-type impurity. The active layer EL may be a layer for emitting light, and may include a multi-quantum well (MQW) having a well layer and a barrier layer having a higher band gap than that of the well layer.

The second semiconductor layer NS2 may be a layer for injecting holes into the active layer EL. The second semiconductor layer NS2 may include a nitride-based semiconductor containing second conductivity type impurities. For example, the second conductivity type impurity may include a P type impurity. The active layer EL may emit light based on a combination of electrons and holes respectively supplied from the first semiconductor layer NS1 and the second semiconductor layer NS2.

The nanorod-shaped light-emitting element includes electrodes having different polarities at both opposing ends, respectively, wherein the electrodes contact the first semiconductor layer and the second semiconductor layer, respectively. In a process of connecting the nanorod-shaped light-emitting element having the electrodes having different polarities to a pad electrode of a substrate, when the electrode of the nanorod-shaped light-emitting element is aligned with the pad electrode having a polarity opposite to the polarity of the electrode of the nanorod-shaped light-emitting element, light emission may not occur.

In this regard, in the light-emitting element ED according to one aspect of the present disclosure, the first electrode E1 is disposed to be in contact with one end face of the first semiconductor layer NS1, while the second semiconductor layer NS2 does not contact an electrode. The first electrode E1 may include a magnetic material. Due to the first electrode E1 including the magnetic material, the alignment of light-emitting elements may be improved. This will be described later with reference to FIGS. 12 to 14.

Figure 2:
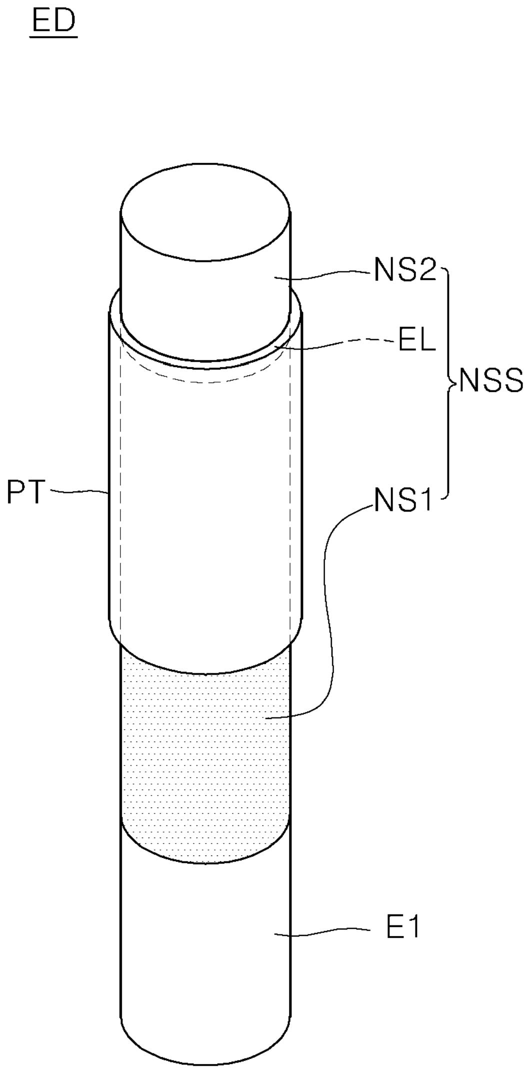
FIG. 2 is a perspective view of a light-emitting element according to another aspect of the present disclosure.

FIG. 2 is a perspective view of a light-emitting element according to another aspect of the present disclosure. Components of the light-emitting element ED are the same as those in FIG. 1 except for a protective layer. Accordingly, components marked with the same reference numerals as in FIG. 1 may be briefly described or omitted.

The light-emitting element ED according to FIG. 2 may include the nitride semiconductor structure NSS and the first electrode E1 disposed on one end face of the nitride semiconductor structure NSS. The nitride semiconductor structure NSS may include a structure in which the first semiconductor layer NS1, the active layer EL, and the second semiconductor layer NS2 are stacked. The first electrode E1 including a magnetic material may be disposed in contact with one end face of the first semiconductor layer NS1. The light-emitting element ED according to another aspect of the present disclosure may be configured to further include a protective layer PT surrounding the active layer EL to distinguish the first semiconductor layer NS1 including N-type impurities and the second semiconductor layer NS2 including P-type impurities from each other. The protective layer PT may include an insulating material such as silicon oxide or silicon nitride.

Figure 3:
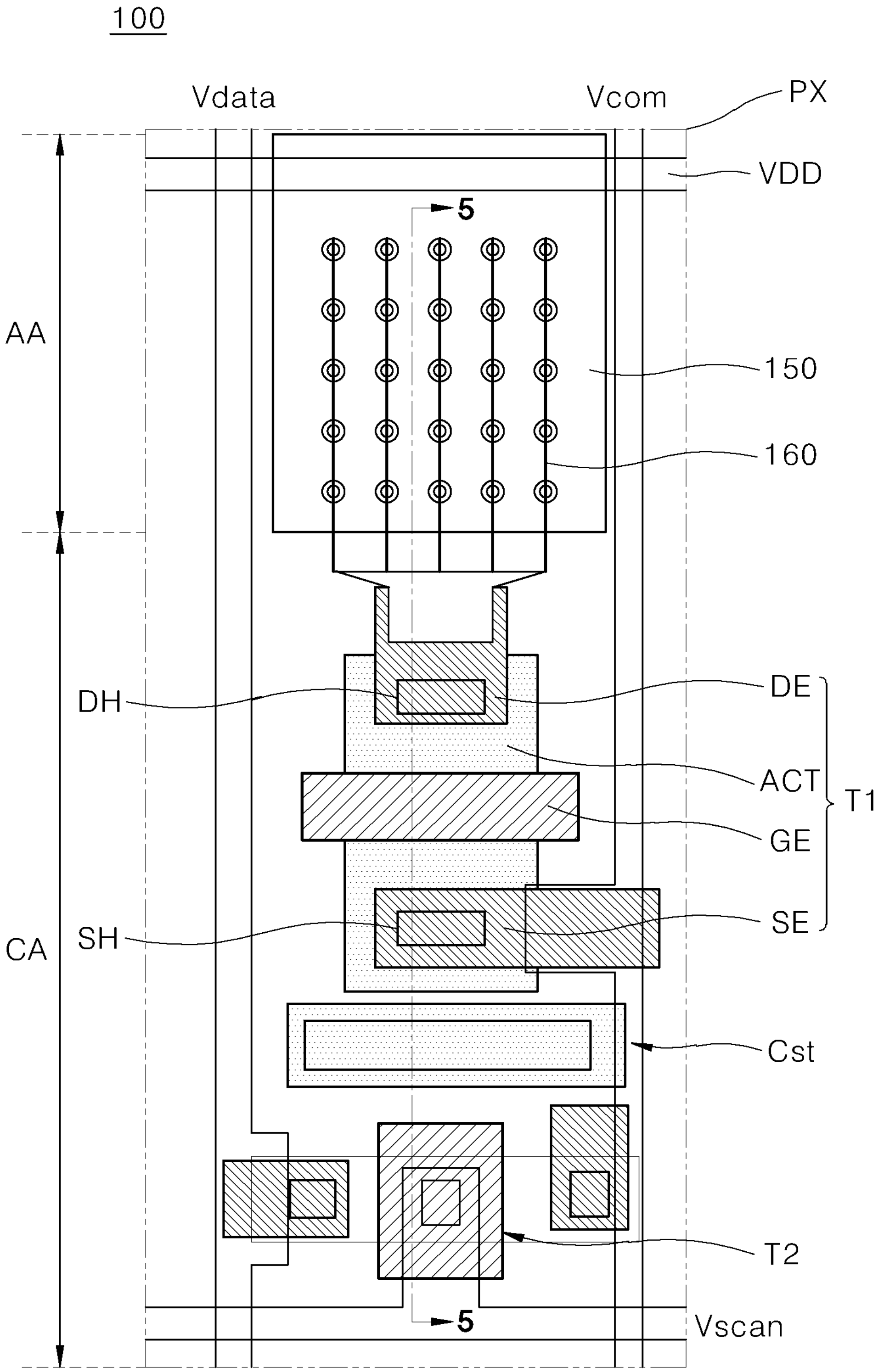
FIG. 3 is a schematic plan view of a display device according to an aspect of the present disclosure.
Figure 4:
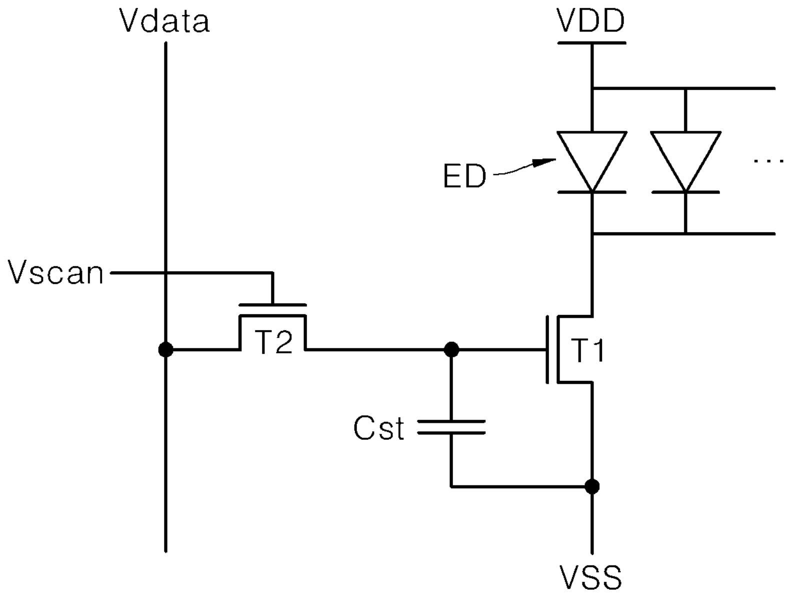
FIG. 4 is a circuit diagram of a display device according to an aspect of the present disclosure.
Figure 5:
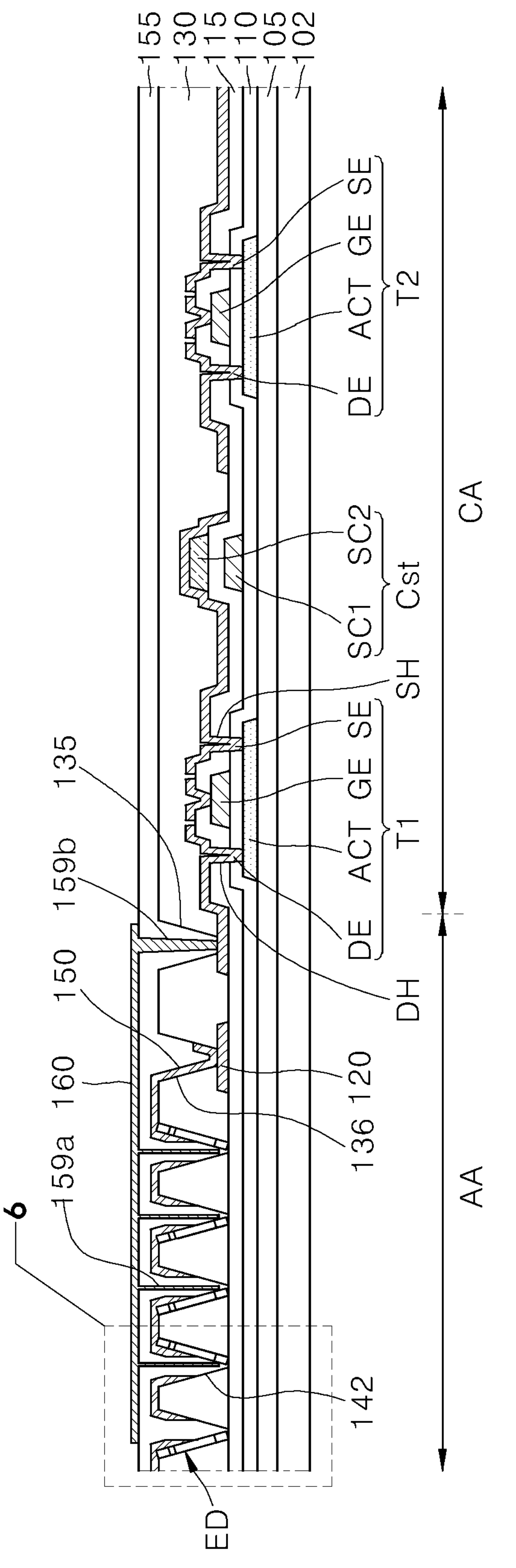
FIG. 5 is a cross-sectional view of 5 in FIG. 3.
Figure 6:
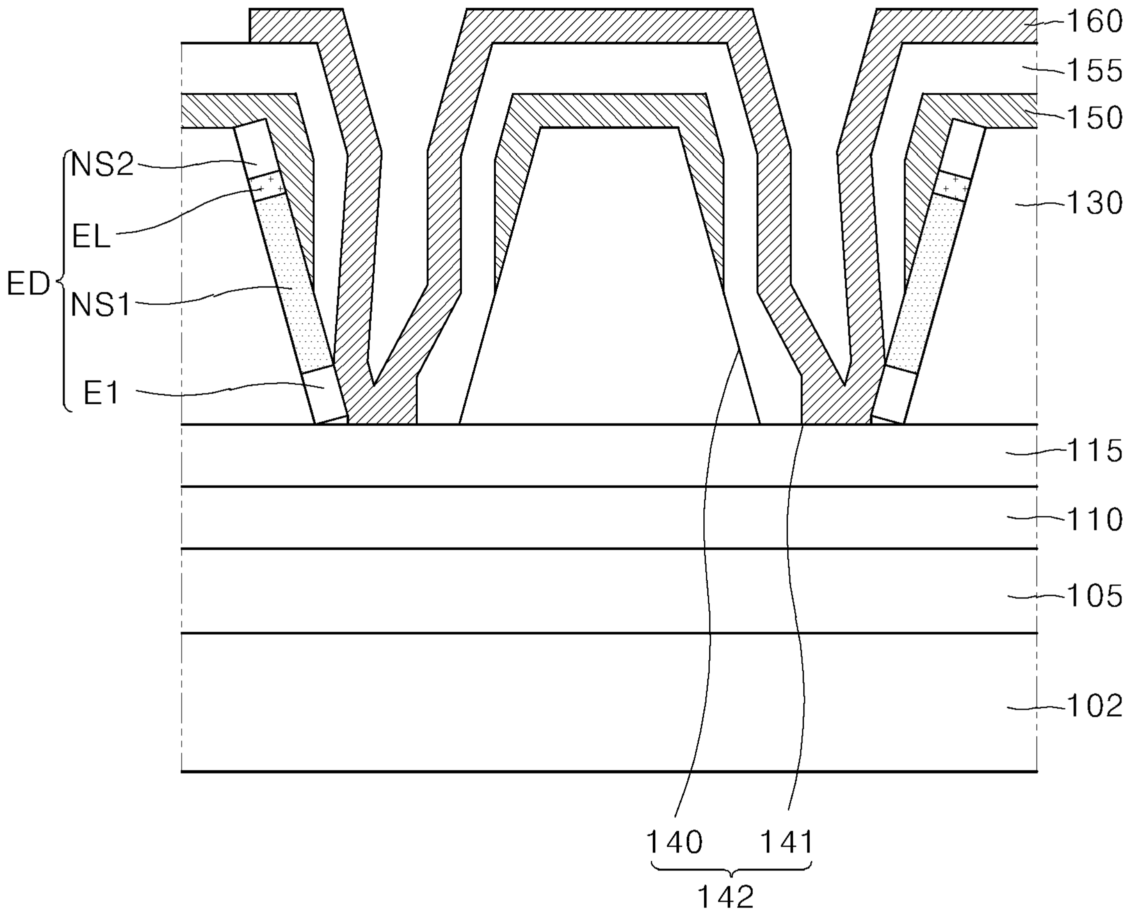
FIG. 6 is an enlarged cross-sectional view of 6 in FIG. 5.

FIG. 3 is a schematic plan view of a display device according to one aspect of the present disclosure. FIG. 4 is a circuit diagram of a display device according to one aspect of the present disclosure. FIG. 5 is a cross-sectional view of 5 in FIG. 3. FIG. 6 is an enlarged cross-sectional view of 6 in FIG. 5. FIG. 3 shows one pixel PX among a plurality of pixels arranged in the display device.

Referring to FIGS. 3 to 6, a display device 100 according to one aspect of the present disclosure may include a display area AA and a circuit area CA. The display area AA may refer to an area in which a plurality of light-emitting elements ED are disposed so that light emitted from the light-emitting elements may be emitted to an outside. The circuit area CA may refer to an area other than the display area AA in which various circuit elements for driving the plurality of light-emitting elements may be disposed. For example, the circuit area CA may include a driving transistor T1, a switching transistor T2, a storage capacitor Cst. and various lines.

A data line Vdata to which a data voltage is applied and a common voltage line Vcom to which a common voltage is applied may be spaced apart from each other and may be disposed respectively on both opposing sides of one pixel PX. The data line Vdata and the common voltage line Vcom may extend in a first direction (e.g., a vertical direction). A high-potential voltage line VDD and a scan line Vscan may be spaced from each other and extend in a second direction to intersect the data line Vdata and the common voltage line Vcom.

A plurality of light-emitting elements, a driving transistor T1, a switching transistor T2, a storage capacitor Cst and various lines may be arranged in an area defined by the data line Vdata and the common voltage line Vcom spaced apart from each other and extending in the first direction and the scan line Vscan and the high-potential voltage line VDD spaced from each other and extending in the second direction to intersect the data line Vdata and the common voltage line Vcom. The driving transistor T1 and the switching transistor T2 may drive the light-emitting element ED, and the storage capacitor Cst may store a voltage therein so that the light-emitting element ED continues to maintain the same state during one frame.

Referring to FIG. 5 and FIG. 6, a buffer layer 105 is disposed on a base substrate 102 including the display area AA and the circuit area CA. The buffer layer 105 may block impurities or moisture through the base substrate 102. The buffer layer 105 may include, for example, an insulating material such as silicon oxide (SiOx) and silicon nitride (SiNx). A light-blocking layer may be further disposed between the base substrate 102 and the buffer layer 105.

The driving transistor T1 is disposed on the buffer layer 105. The driving transistor T1 may include a semiconductor layer ACT, a gate electrode GE, and a first interlayer insulating layer 110 located between the semiconductor layer ACT and the gate electrode GE and serving as a gate insulating layer. The semiconductor layer ACT may include an active area overlapping with the gate electrode GE to constitute a channel, and a source area and a drain area located respectively on both opposing sides of the active area, while the active area is disposed therebetween. The first interlayer insulating layer 110 may be disposed on an entire surface of the base substrate 102. A second interlayer insulating layer 115 may be disposed on the gate electrode GE.

The driving transistor T1 may include a source contact-hole SH and a drain contact-hole DH that extend through the second interlayer insulating layer 115 and the first interlayer insulating layer 110 to respectively expose portions of surfaces of the source area and the drain area located respectively on both opposing sides of the semiconductor layer ACT. A source electrode SE and a drain electrode DE may be respectively disposed on the source contact-hole SH and the drain contact-hole DH to be electrically connected to the source area and the drain area of the semiconductor layer ACT via the source contact-hole SH and the drain contact-hole DH, respectively.

The switching transistor T2 is spaced apart from the driving transistor T1. The switching transistor T2 may include a semiconductor layer ACT, a gate electrode GE, and the first interlayer insulating layer 110 located between the semiconductor layer ACT and the gate electrode GE and serving as a gate insulating layer. The semiconductor layer ACT may include an active area overlapping with the gate electrode GE to constitute a channel, and a source area and a drain area respectively located on both opposing sides of the active area while the active area is disposed therebetween. The switching transistor T2 may include a source electrode SE and a drain electrode DE extending through the second interlayer insulating layer 115 and the first interlayer insulating layer 110 to be electrically connected to the source area and the drain area of the semiconductor layer ACT.

The storage capacitor Cst may include a first capacitor electrode SC1 and a second capacitor electrode SC2. The first capacitor electrode SC1 may be disposed on the first interlayer insulating layer 110. The first capacitor electrode SC1 may be made of the same material as that of the gate electrode GE. The second interlayer insulating layer 115 may be disposed on the first capacitor electrode SC1 and may act as a dielectric layer. The second capacitor electrode SC2 may be disposed on the second interlayer insulating layer 115.

A signal line 120 may be coplanar with the source electrode SE and the drain electrode DE and may be disposed on the second interlayer insulating layer 115. The signal line 120 may include a plurality of signal lines. For example, the plurality of signal lines may include a plurality of scan lines Vscan, a plurality of high-potential voltage lines VDD, a plurality of data lines Vdata, and the common voltage line Vcom.

A planarization layer 130 covering the plurality of signal lines 120 and the source electrode SE and the drain electrode DE may be disposed. The planarization layer 130 may have a plurality of first debossing grooves 142 and a plurality of openings 135 and 136 defined therein. The first debossing groove 142 may include an inclined side surface 140 and a bottom surface 141. The bottom surface 141 of the first debossing groove 142 may be a flat surface, and the inclined side surface 140 may be inclined at a predetermined angle relative to the bottom surface. The first debossing groove 142 may have a circular shape in a top view, but not limited thereto. A length of the inclined side surface 140 of the first debossing groove 142 may be smaller than or equal to a length of the light-emitting element ED. The light-emitting element ED may be disposed on and in contact with the inclined side surface 140 of the first debossing groove 142.

The light-emitting element ED may have a nanorod structure in which the first semiconductor layer NS1, the active layer EL, and the second semiconductor layer NS2 are stacked. The first electrode E1 of the light-emitting element ED may include the magnetic material and may be disposed on and in contact with the bottom surface 141 of the first debossing groove 142.

In a portion of the display area AA in which the plurality of first debossing grooves 142 are disposed, not a line but a multi-layered insulating layer structure is disposed under the plurality of first debossing grooves.

In a portion of the display area AA in which the plurality of first debossing grooves 142 are disposed, the second electrode line 150 may be disposed on a portion of the planarization layer 130 having the plurality of first debossing grooves 142 defined therein. The second electrode line 150 may be disposed in an entirety of the display area AA, and may be formed to surround an outer circumferential surface of an upper portion of a portion of the planarization layer 130 between adjacent first debossing grooves 142 having a circular shape in the top view: The second electrode line 150 may be formed to extend along the inclined side surface 140 of the first debossing groove 142. The second electrode line 150 may extend along and on a top face of the portion of the planarization layer 130 between adjacent first debossing grooves 142. Accordingly, the second electrode line 150 may contact the second semiconductor layer NS2 of the light-emitting element ED. Further, the second electrode line 150 may contact a top face of the signal line 120 as exposed through the opening 136. The second electrode line 150 may include a transparent metal oxide such as indium-tin-oxide (ITO) or indium-zinc-oxide (IZO).

An insulating layer 155 may be disposed on the planarization layer 130 on which the second electrode line 150 has been disposed. The insulating layer 155 may have a plurality of contact-holes 159*a* and 159*b* defined therein. The plurality of contact-holes 159*a* and 159*b* may include a first contact-hole 159*a* extending through the insulating layer 155 to expose the first electrode E1 of the light-emitting element ED received in the first debossing groove 142, and a second contact-hole 159*b* extending through the insulating layer 155 to expose a portion of the top surface of the drain electrode DE.

A first electrode line 160 may fill each of the plurality of contact-holes 159*a* and 159*b*. The first electrode line 160 may contact and be electrically connected to the first electrode E1 of the light-emitting element ED exposed through the first contact-hole 159*a*. Further, the first electrode line 160 may contact and be electrically connected to the portion of the drain electrode DE exposed through the second contact-hole 159*a*.

Referring back to FIG. 3, in the top view; the first electrode line 160 may extend from the drain electrode DE and may extend in a column direction to electrically connect light-emitting elements arranged along a column in the display area AA to each other. Accordingly, as shown in FIG. 4, the plurality of light-emitting elements respectively aligned with and received in the plurality of first debossing grooves 142 may operate in a parallel manner.

According to one aspect of the present disclosure, each of the plurality of light-emitting elements may be oriented such that the first electrode including the magnetic material may be positioned at the bottom surface of each of the plurality of first debossing grooves disposed on the display area of the base substrate. Accordingly, the defect that light emission does not occur due to the alignment of the electrode of the light-emitting element and the pad electrode having opposite polarities with each other may be prevented. Further, the debossing groove may have a protrusion on the bottom surface thereof, such that at last two light-emitting elements may be received in one debossing groove, thereby improving luminance of the display device, and thus driving the display device at a low power level and thus reducing power consumption.

Figure 7:
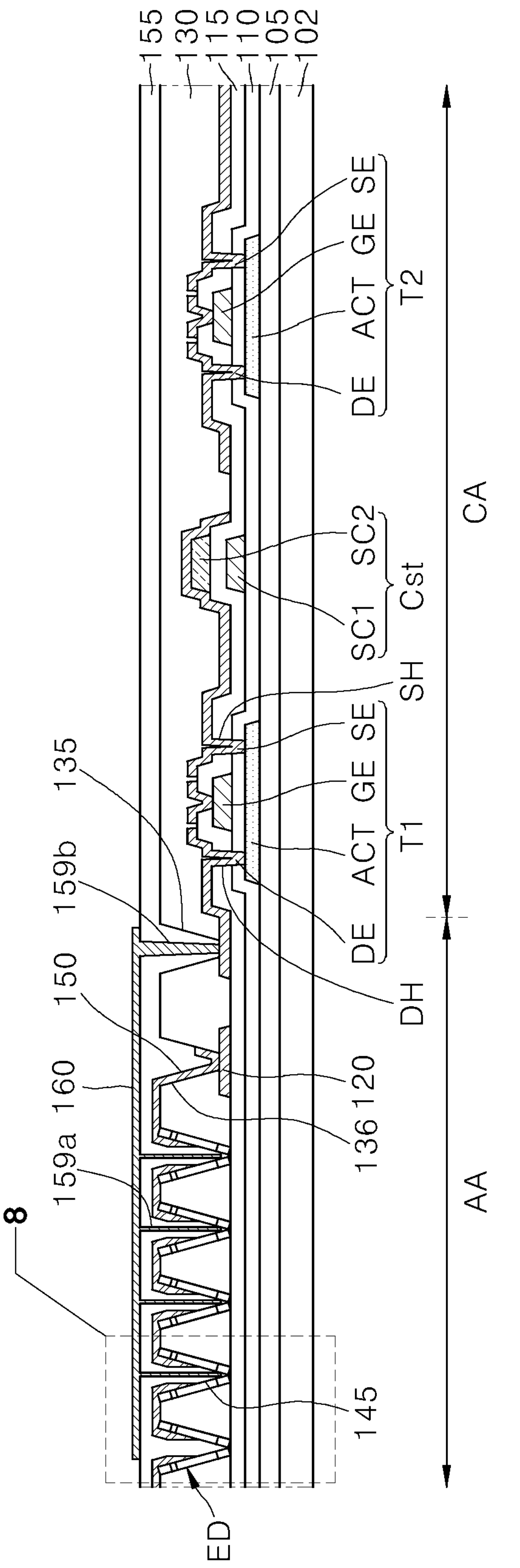
FIG. 7 is a cross-sectional view of a display device according to another aspect of the present disclosure.
Figure 8:
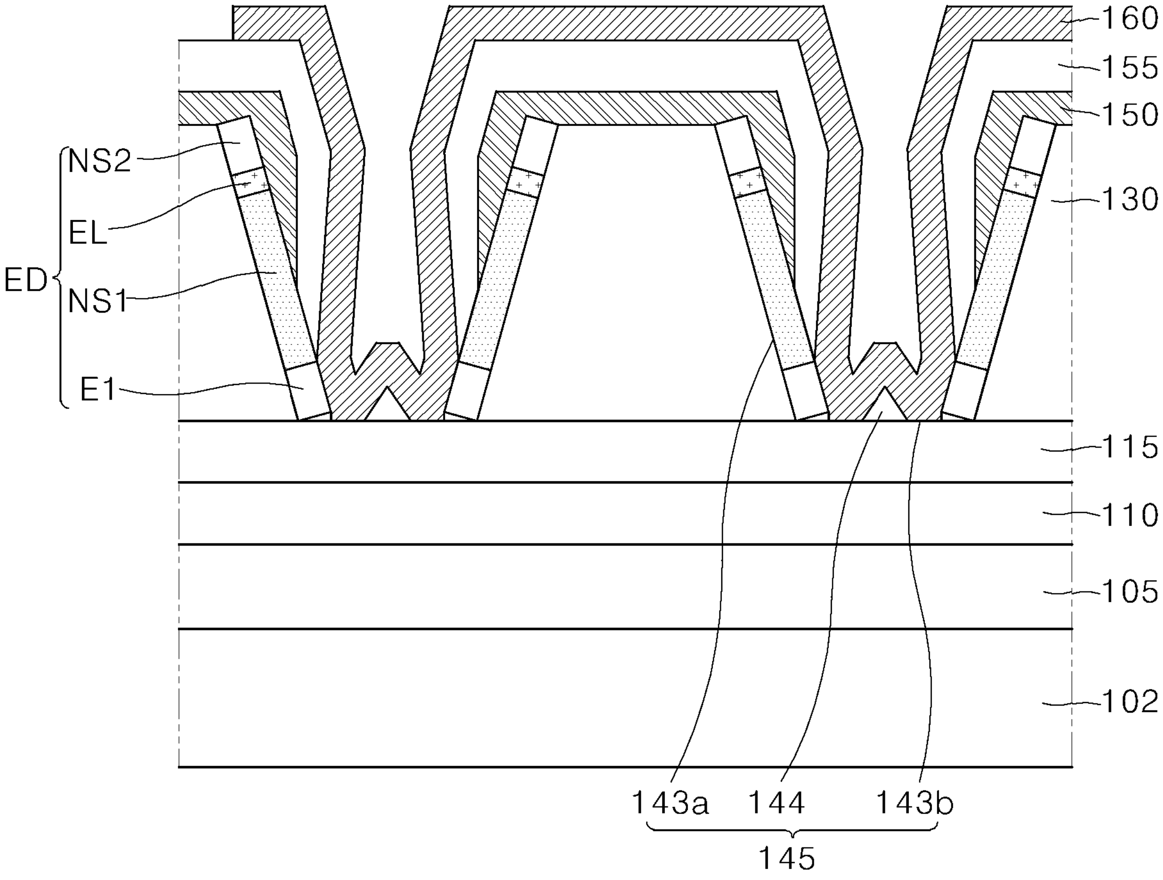
FIG. 8 is an enlarged cross-sectional view of 8 in FIG. 7.

FIG. 7 is a cross-sectional view of a display device according to another aspect of the present disclosure. FIG. 8 is an enlarged cross-sectional view of 8 in FIG. 7. A configuration of the display device in FIG. 7 is identical to the configuration in FIG. 5 except for a second debossing groove 145 defined on the display area AA of the base substrate. Accordingly, components marked with the same reference numerals as in FIG. 5 may be briefly described or omitted.

Referring to FIGS. 7 and 8, the planarization layer 130 having a plurality of second debossing grooves 145 defined therein may be disposed on the display area AA of the base substrate. The second debossing groove 145 may include an inclined side surface 143*a*, a flat bottom surface 143*b*, and a protrusion 144 protruding from the bottom surface 143*b*. The second debossing groove 145 may have a cone-shaped cross-sectional shape in which a width thereof gradually decreases as the groove 145 extends downwardly to the bottom surface 143*b*. The protrusion 144 disposed at and on a center of the bottom surface 143*b* of the second debossing groove 145 may have an outer surface area smaller than a cross-sectional area of the light-emitting element ED in a diameter direction, and may have an inclined side surface so that the light-emitting element ED does not contact the protrusion 144.

At least two light-emitting elements ED may be disposed on and in contact with the inclined side surface 143*a* of the second debossing groove 145. At least two light-emitting elements ED may not overlap with each other due to the protrusion 144.

Each of at least two light-emitting elements ED disposed in the second debossing groove 145 may be oriented such that the first electrode E1 of each of the light-emitting elements ED made of the magnetic material contacts the bottom surface 143*b*. The light-emitting element ED may have, for example, a nanorod structure in which the first semiconductor layer NS1, the active layer EL, and the second semiconductor layer NS2 are stacked.

The second electrode line 150 may be disposed on a portion of the planarization layer 130 having the plurality of second debossing grooves 145 defined therein in the display area AA. The second electrode line 150 may be disposed in an entirety of the display area AA and may be formed to surround an outer circumferential surface of an upper portion of a portion of the planarization layer 130 disposed between adjacent second debossing grooves 145. The second electrode line 150 may be formed to extend along and on the inclined side surface 143*a*. Accordingly, the second electrode line 150 may contact the second semiconductor layer NS2 of the light-emitting element ED. Further, the second electrode line 150 may contact the top face of the signal line 120 exposed through the opening 136. The second electrode line 150 may include a transparent metal oxide such as indium-tin-oxide (ITO) or indium-zinc-oxide (IZO).

The insulating layer 155 may be disposed on the planarization layer 130 on which the second electrode line 150 has been disposed. The insulating layer 155 may have the plurality of contact-holes 159*a* and 159*b* defined therein. The plurality of contact-holes 159*a* and 159*b* may include the first contact-hole 159*a* extending through the insulating layer 155 to expose the first electrode E1 of the light-emitting element ED received in the second debossing groove 145, and a second contact-hole 159*b* extending through the insulating layer 155 to expose a portion of the top surface of the drain electrode DE.

The first electrode line 160 may fill each of the plurality of contact-holes 159*a* and 159*b*. The first electrode line 160 may contact and be electrically connected to the first electrode E1 of the light-emitting element ED exposed through the first contact-hole 159*a*. Further, the first electrode line 160 may contact and be electrically connected to the portion of the drain electrode DE exposed through the second contact-hole 159*b*.

According to another aspect of the present disclosure, at least two light-emitting elements may be received in one second debossing groove, thereby improving luminance of the display device.

Hereinafter, a method for manufacturing a display device according to aspects of the present disclosure will be described with reference to the drawings.

Figure 9:
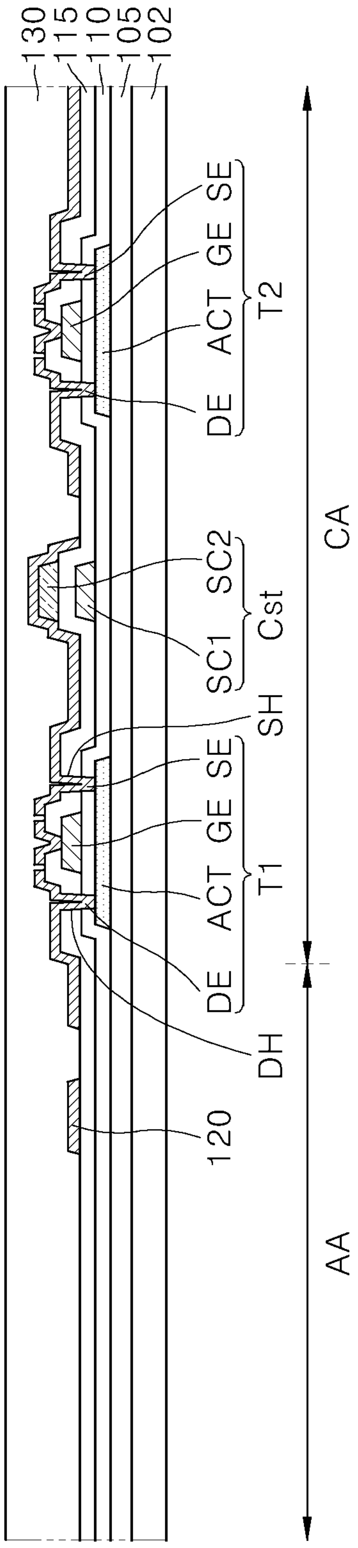
FIGS. 9 to 17 are diagrams illustrating a method for manufacturing a display device according to an aspect of the present disclosure.

FIGS. 9 to 17 are diagrams illustrating a method for manufacturing a display device according to an aspect of the present disclosure. Referring to FIG. 9, the base substrate 102 may include the display area AA and the circuit area CA. The display area AA refers to an area in which a plurality of light-emitting elements ED is disposed. The circuit area CA refers to an area in which the driving transistor T1, the switching transistor T2, the storage capacitor Cst, and various lines are disposed.

The buffer layer 105 is disposed on the base substrate 102 including the display area AA and the circuit area CA. The buffer layer 105 may block impurities or moisture through the base substrate 102. The buffer layer 105 may include, for example, an insulating material such as silicon oxide (SiOx) and silicon nitride (SiNx). The driving transistor T1 is disposed on the buffer layer 105. The driving transistor T1 may include the semiconductor layer ACT, the gate electrode GE, and the first interlayer insulating layer 110 located between the semiconductor layer ACT and the gate electrode GE and serving as a gate insulating layer. The semiconductor layer ACT may include an active area overlapping with the gate electrode GE to constitute a channel, and a source area and a drain area located respectively on both opposing sides of the active area, while the active area is disposed therebetween. The first interlayer insulating layer 110 may be disposed on an entire surface of the base substrate 102. The second interlayer insulating layer 115 may be disposed on the gate electrode GE.

The driving transistor T1 may include the source contact-hole SH and the drain contact-hole DH that extend through the second interlayer insulating layer 115 and the first interlayer insulating layer 110 to respectively expose portions of surfaces of the source area and the drain area located respectively on both opposing sides of the semiconductor layer ACT. The source electrode SE and the drain electrode DE of the driving transistor T1 may be respectively disposed on the source contact-hole SH and the drain contact-hole DH to be electrically connected to the source area and the drain area of the semiconductor layer ACT via the source contact-hole SH and the drain contact-hole DH, respectively.

The switching transistor T2 may be disposed to be spaced apart from the driving transistor T1. The switching transistor T2 may include the semiconductor layer ACT, the gate electrode GE, and the first interlayer insulating layer 110 located between the semiconductor layer ACT and the gate electrode GE and serving as a gate insulating layer. The semiconductor layer ACT may include an active area overlapping with the gate electrode GE to constitute a channel, and a source area and a drain area respectively located on both opposing sides of the active area while the active area is disposed therebetween. The switching transistor T2 may include a source electrode SE and a drain electrode DE extending through the second interlayer insulating layer 115 and the first interlayer insulating layer 110 to be electrically connected to the source area and the drain area of the semiconductor layer ACT.

The storage capacitor Cst may include the first capacitor electrode SC1 and the second capacitor electrode SC2. The first capacitor electrode SC1 may be disposed on the first interlayer insulating layer 110. The first capacitor electrode SC1 may be made of the same material as that of the gate electrode GE. The second interlayer insulating layer 115 may be disposed on the first capacitor electrode SC1 and may act as a dielectric layer. The second capacitor electrode SC2 may be disposed on the second interlayer insulating layer 115.

The signal line 120 may be coplanar with the source electrode SE and the drain electrode DE and may be disposed on the second interlayer insulating layer 115. The signal line 120 may include a plurality of signal lines. For example, the plurality of signal lines may include a plurality of scan lines Vscan, a plurality of high-potential voltage lines VDD, a plurality of data lines Vdata, and the common voltage line Vcom.

The planarization layer 130 covering the plurality of signal lines 120 and the source electrode SE and the drain electrode DE may be disposed. The planarization layer 130 serves to remove a surface step caused by an underlying structure such as the driving transistor T1. The planarization layer 130 may include a photoactive compound (PAC). However, the present disclosure is not limited thereto.

Figure 10:
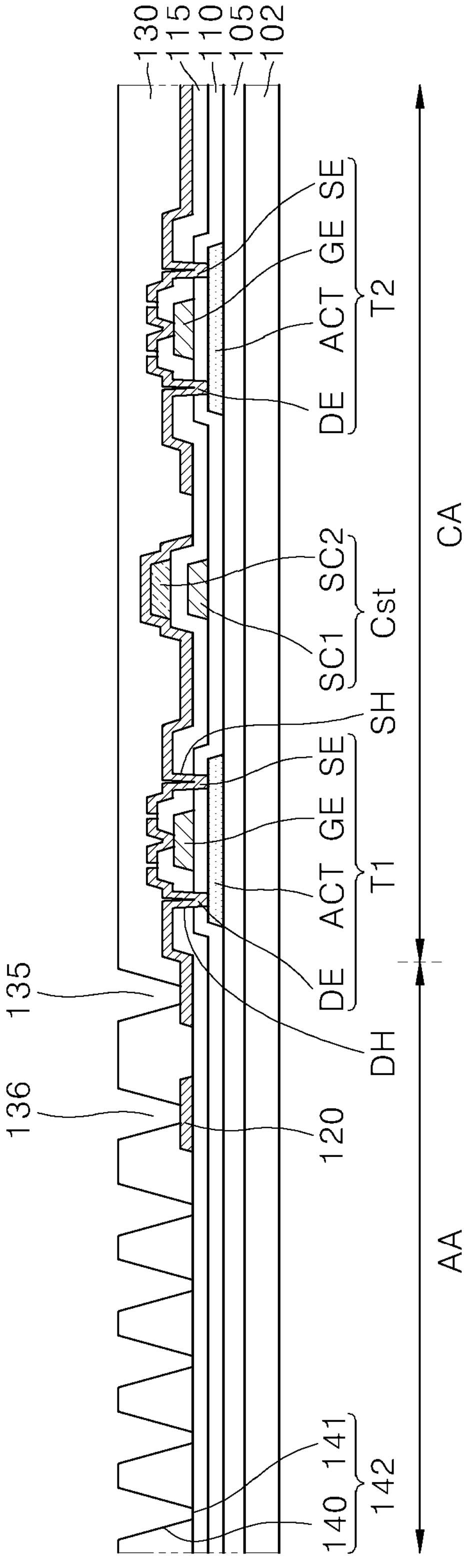
Figure 11:
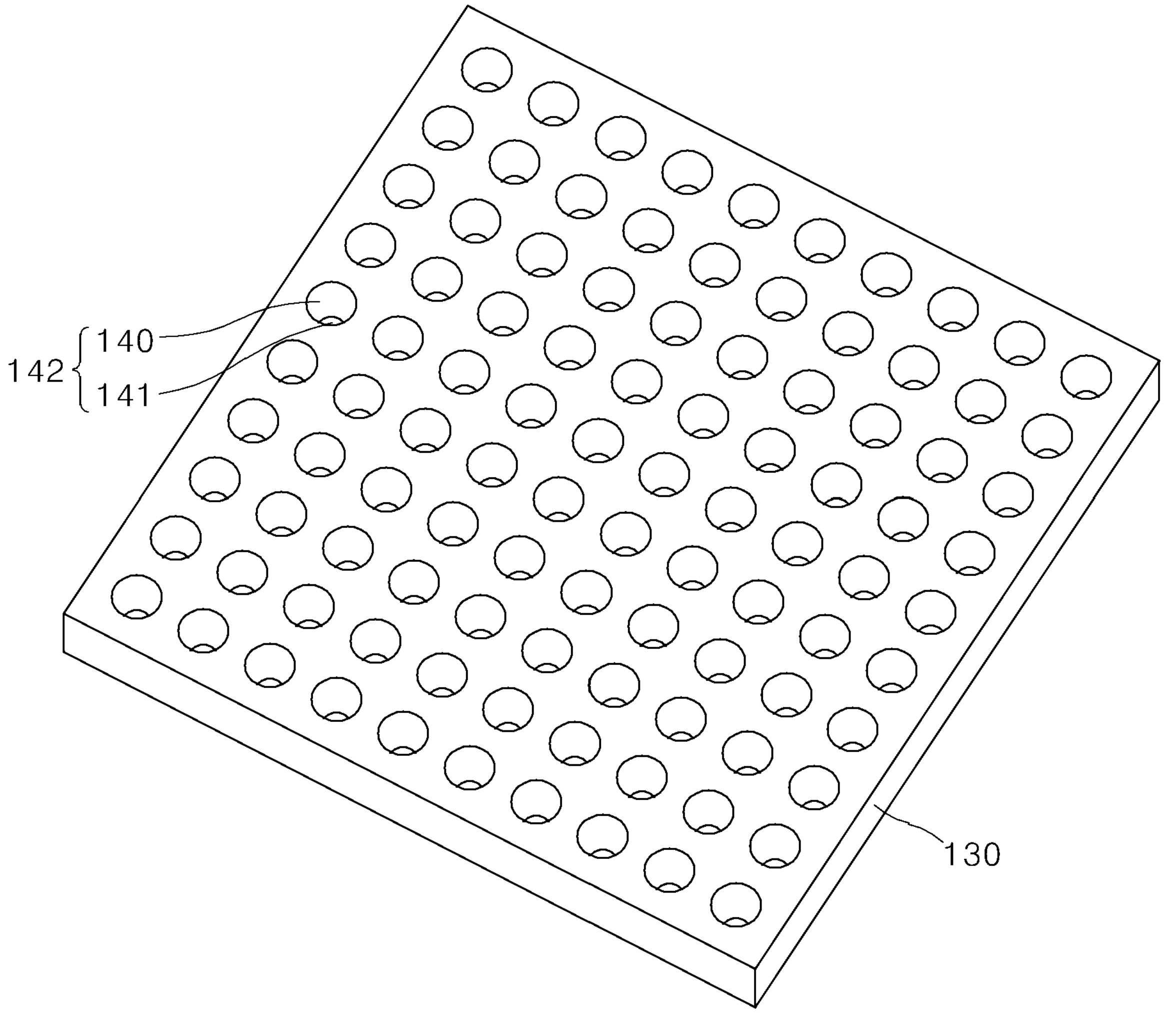

Referring to FIG. 10 and FIG. 11, the plurality of first debossing groove 142 and the plurality of openings 135 and 136 are defined in a portion of the planarization layer 130 disposed on the display area AA. The planarization layer 130 may have the plurality of first debossing grooves 142 and the plurality of openings 135 and 136 defined therein. The first debossing groove 142 may include the inclined side surface 140 and the bottom surface 141. The bottom surface 141 of the first debossing groove 142 may be a flat surface, and the inclined side surface 140 may be inclined at a predetermined angle relative to the bottom surface. The first debossing groove 142 may have a circular shape in a top view as shown in FIG. 11.

The first debossing groove 142 may provide a space in which the light-emitting element is received later. The length of the inclined side surface 140 of the first debossing groove 142 may be smaller than or equal to the length of the light-emitting element ED. A length of the bottom surface 141 of the first debossing groove 142 may be sized such that both when the light-emitting element is in contact with the inclined side surface 140 and when the light-emitting element is spaced away from the inclined side surface 140, the light-emitting element is not displaced by a size of a diameter of a top of the light-emitting element or greater. For example, the length of the bottom surface 141 of the first debossing groove 142 may be larger than the diameter of the light-emitting element and may be smaller than two times of the diameter of the light-emitting element.

Accordingly, the first debossing groove 142 may have a cone-shaped cross-sectional shape in which a width thereof gradually decreases as the groove 142 extends downwardly to the bottom surface 141.

In a portion of the display area AA in which the plurality of first debossing grooves 142 are disposed, not a line but a multi-layered insulating layer structure is disposed under the plurality of first debossing grooves. A magnetic field may be used in a self-assembly process for aligning the light-emitting elements with the plurality of first debossing grooves 142. Accordingly, to prevent the line from being affected or damaged by the magnetic field, in the portion of the display area AA in which the plurality of first debossing grooves 142 are disposed, the line is not disposed under the plurality of first debossing grooves.

The plurality of openings 135 and 136 defined in the planarization layer 130 may include the first opening 135 exposing a portion of the surface of the drain electrode DE and the second opening 136 exposing a portion of the surface of the signal line 120.

Figure 12:
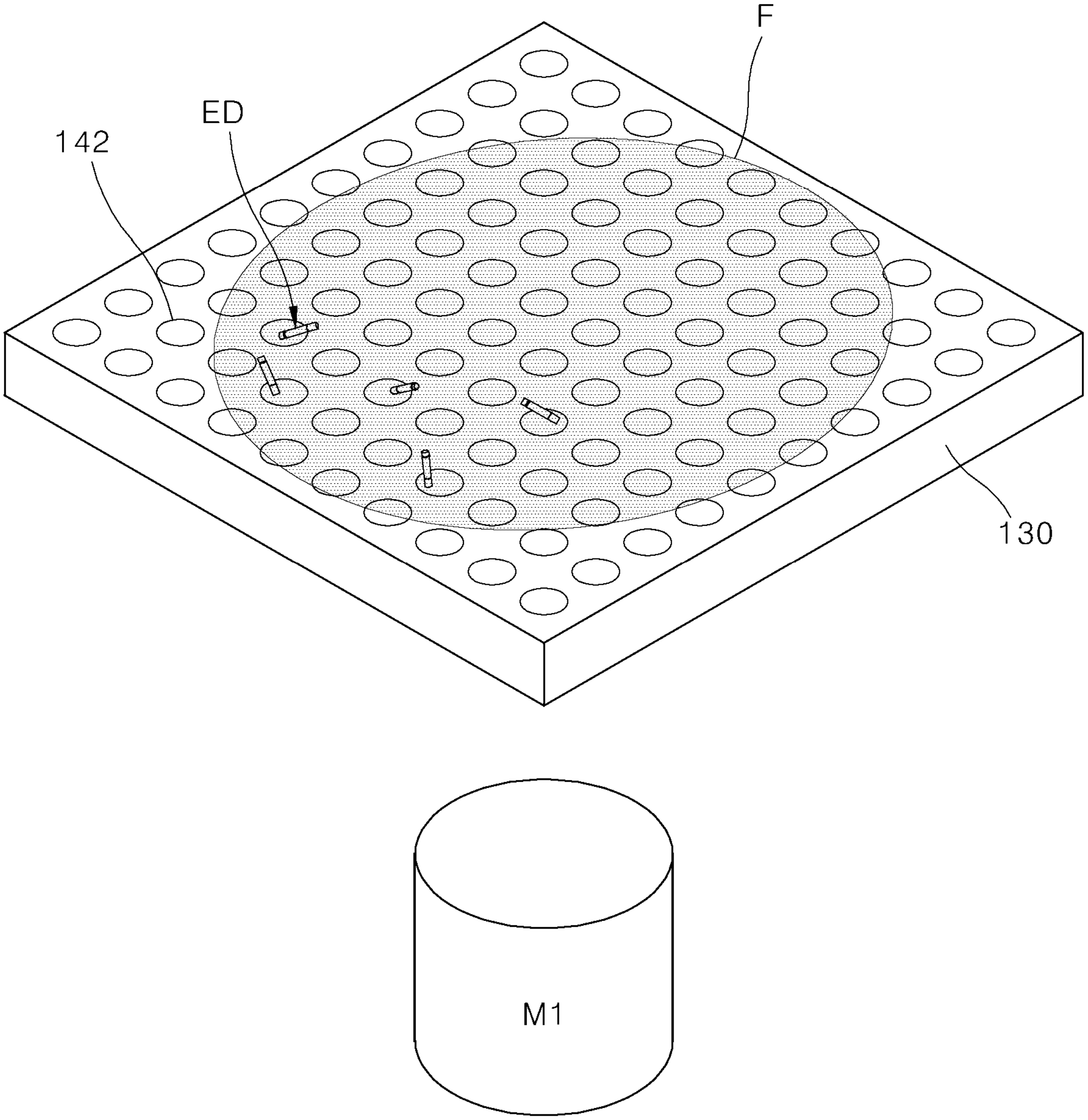
Figure 13:
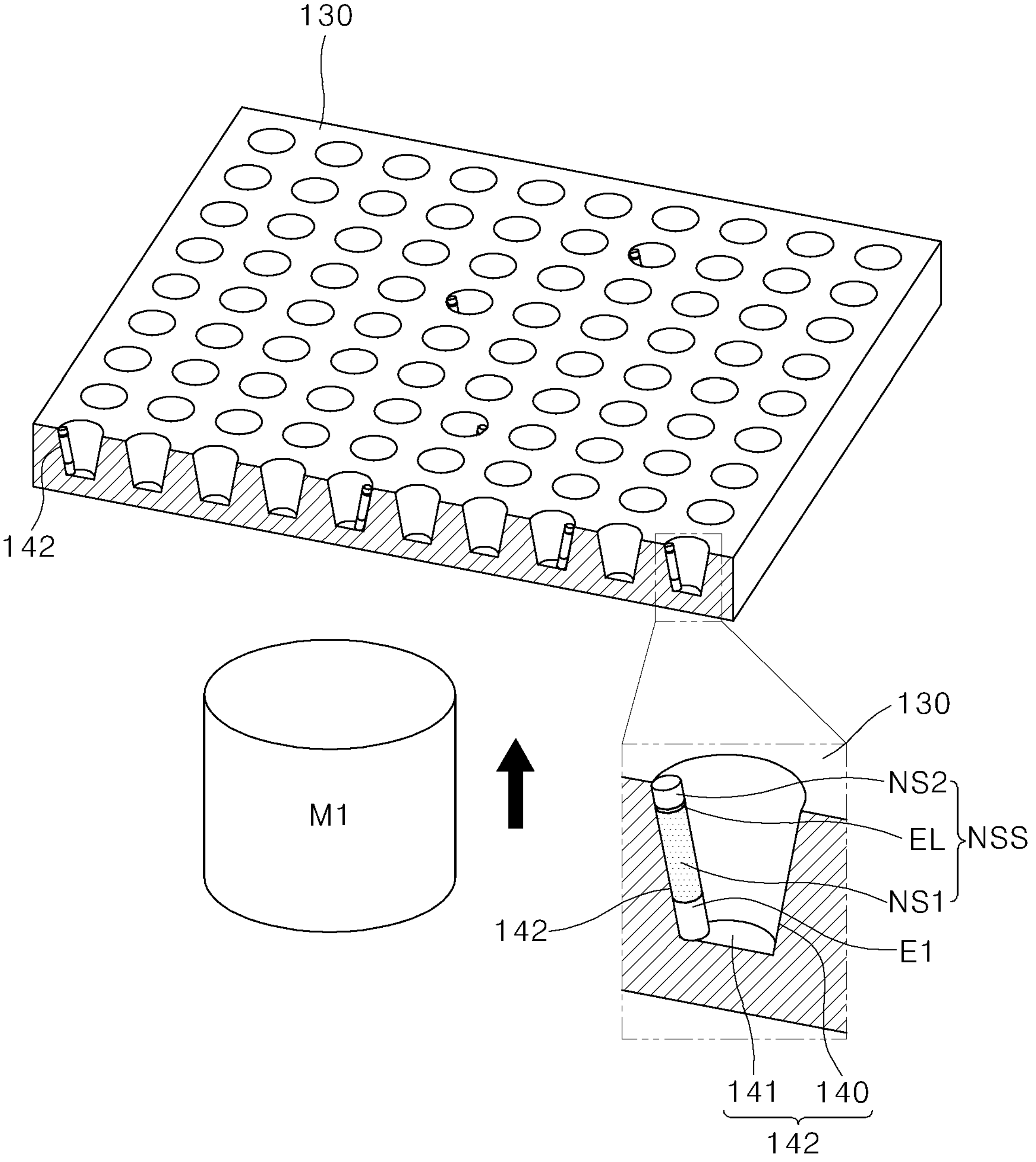
Figure 14:
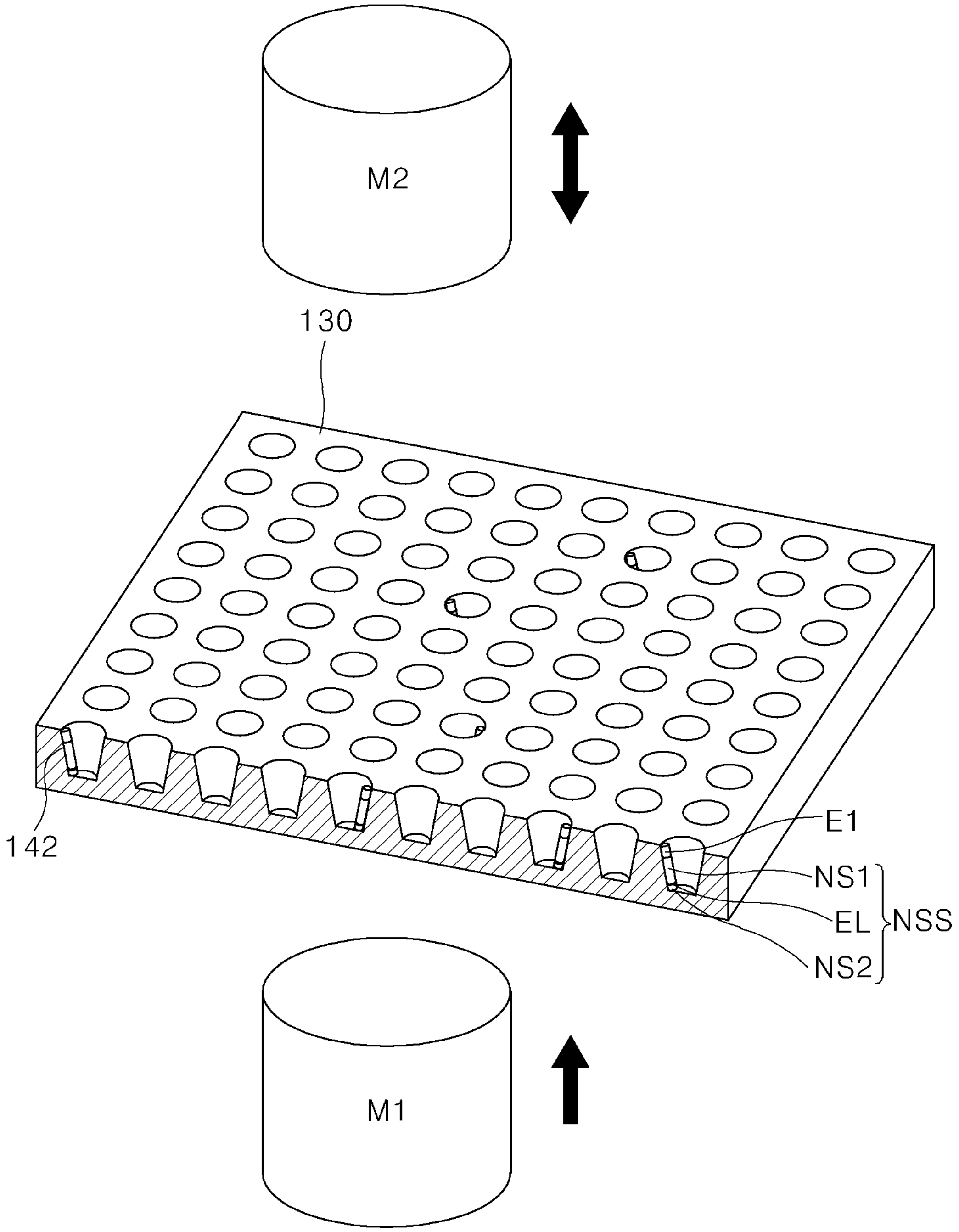

Referring to FIGS. 12 to 14, a self-alignment process of aligning the light-emitting elements with the plurality of first debossing grooves 142 defined in the planarization layer 130 is performed. To this end, first referring to FIG. 12, the fluid F in which the plurality of light-emitting elements ED are dispersed on is supplied on the planarization layer 130. The fluid F in which the plurality of light-emitting elements ED are dispersed may be ejected through an inkjet nozzle.

A first alignment magnet M1 having a first magnetic flux density is placed on the other surface opposite to one surface of the planarization layer 130 in which the plurality of first debossing grooves 142 are defined. Using a translational motion of the first alignment magnet M1, each of the plurality of light-emitting elements ED dispersed in the fluid F is aligned with and received in the debossing groove 142, as shown in FIG. 13. When the first alignment magnet M1 moves toward the planarization layer 130 in which the plurality of first debossing grooves 142 are defined, the first electrode E1 of the light-emitting element ED disposed at one end thereof and made of the magnetic material moves toward the magnet. Then, while the light-emitting element ED moves along the inclined side surface 140 of the first debossing groove 142, the light-emitting element ED may be oriented such that the first electrode E1 of the light-emitting element ED made of the magnetic material may contact the bottom surface 141.

In one example, as shown in FIG. 14, the first electrode E1 of the light-emitting element ED may not be disposed on the bottom surface 141 of each of the plurality of first debossing grooves 142 and may be reversely aligned. Specifically, the first electrode E1 may be disposed toward the upper opening of the first debossing grove 142.

In this case, a second alignment magnet M2 which has a relatively lower magnetic flux density than that of the first alignment magnet M1 which has the first flux density moves from a position above the planarization layer 130 toward the planarization layer 130 while the second alignment magnet M2 is opposite to the first alignment magnet M1 in the gravitational direction. When the second alignment magnet M2 moves in the upper and lower directions, the light-emitting element ED is turned upside down such that the first electrode E1 of the light-emitting element ED made of the magnetic material may contact the bottom surface 141 of the first debossing groove 142, as shown in FIG. 15.

Figure 15:
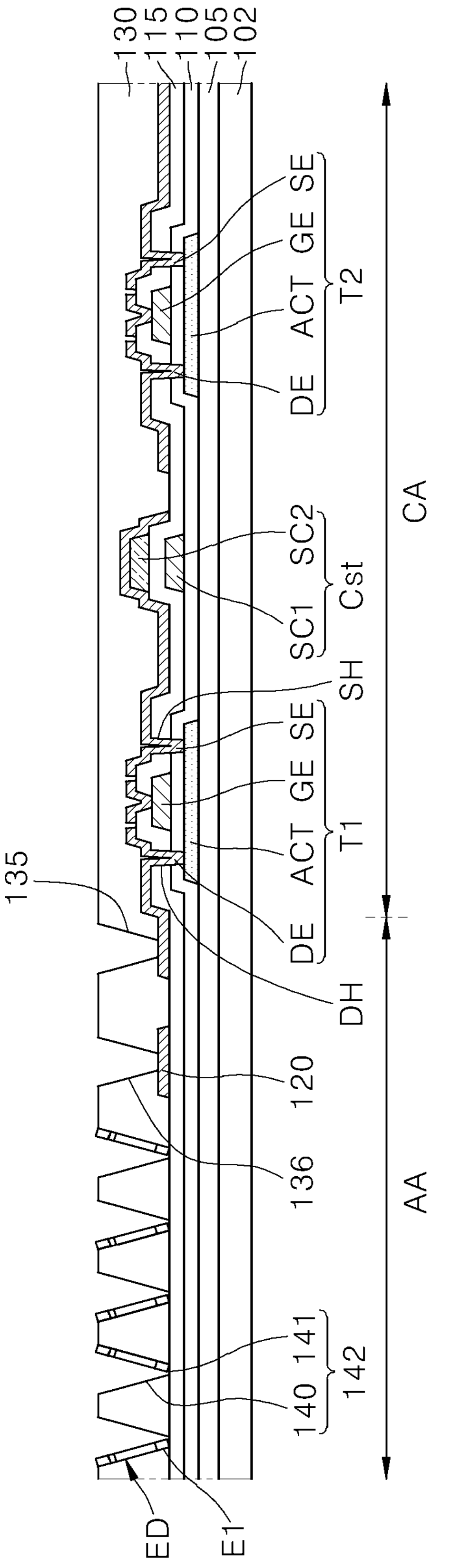

Referring to FIG. 15, the nanorod-shaped light-emitting element ED may be disposed on and in contact with the inclined side surface of the first debossing groove 142. For example, the light-emitting element ED may be oriented so that the first electrode E1 made of the magnetic material contacts the bottom surface of the first debossing groove 142. Further, the nanorod-shaped light-emitting element ED may be placed on and contact the left inclined side surface 140 of the first debossing groove 142 or may be placed on and contact the right inclined side surface 140 of the first debossing groove 142. A position of the nanorod-shaped light-emitting element ED placed in the first debossing groove 142 may be irregular per the first debossing groove 142.

Figure 16:
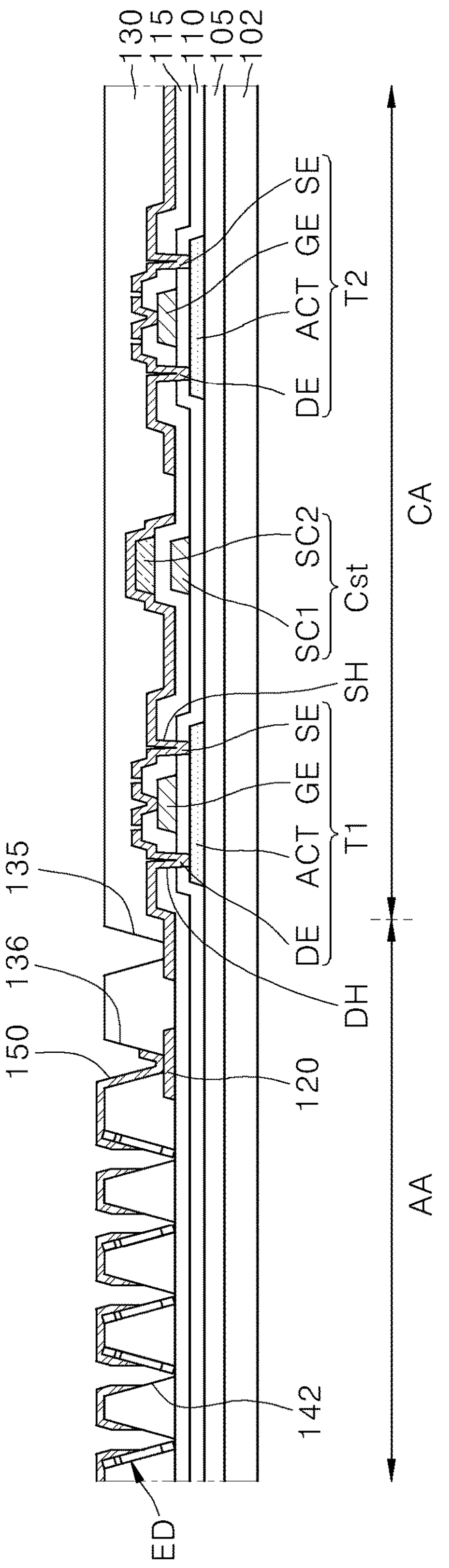

Referring to FIG. 16, the second electrode line 150 may be disposed on a portion of the planarization layer 130 having the plurality of first debossing grooves 142 defined therein in the display area AA. The second electrode line 150 may be disposed in an entirety of the display area AA and may be formed to surround an outer circumferential surface of an upper portion of a portion of the planarization layer 130 disposed between adjacent first debossing grooves 142. Accordingly, the second electrode line 150 may contact the second semiconductor layer NS2 of the light-emitting element ED. Further, the second electrode line 150 may be formed to extend along and on the inclined side surface 140. The second electrode line 150 may be formed to extend along and on an inclined side surface of the opening 136. Thus, the second electrode line 150 may contact the top face of the signal line 120 exposed through the opening 136. The second electrode line 150 may include a transparent metal oxide such as indium-tin-oxide (ITO) or indium-zinc-oxide (IZO).

Figure 17:
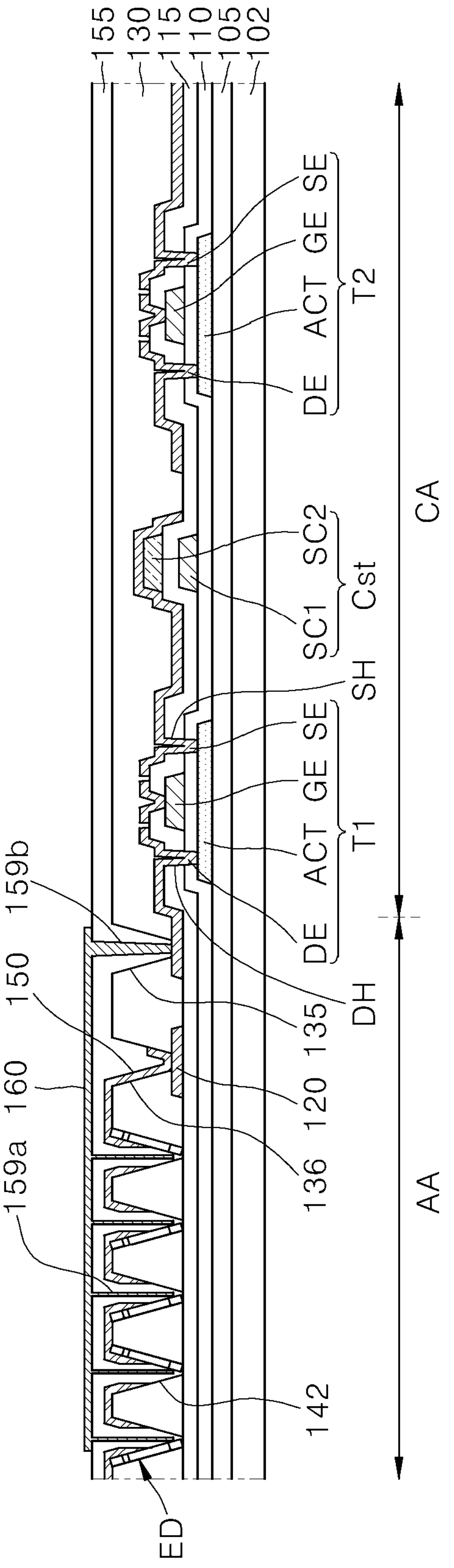

Referring to FIG. 17, the insulating layer 155 may be disposed on the planarization layer 130 in which the plurality of first debossing grooves 142 are defined and on which the second electrode line 150 has been disposed. The insulating layer 155 may have the plurality of contact-holes 159*a* and 159*b* defined therein. The plurality of contact-holes 159*a* and 159*b* may include the first contact-hole 159*a* extending through the insulating layer 155 to expose the first electrode E1 of the light-emitting element ED disposed in the display area AA and received in the first debossing groove 142, and the second contact-hole 159*b* extending through the insulating layer 155 to expose a portion of the top surface of the drain electrode DE of the driving transistor T1 of the circuit area CA.

Next, the first electrode line 160 is formed on the insulating layer 155. The first electrode line 160 may fill each of the plurality of contact-holes 159*a* and 159*b*. The first electrode line 160 may contact and be electrically connected to the first electrode E1 of the light-emitting element ED exposed through the first contact-hole 159*a*. Further, the first electrode line 160 may contact and be electrically connected to the portion of the drain electrode DE exposed through the second contact-hole 159*b* and thus may be electrically connected to the driving transistor T1. The first electrode line 160 may include a transparent metal oxide such as indium-tin-oxide (ITO) or indium-zinc-oxide (IZO).

According to one aspect of the present disclosure, the cone-shaped first debossing groove 142 is defined on the display area of the base substrate 102. Then, the magnetic field is generated in a vertical upwardly direction from a position under the bottom surface of the first debossing groove 142 toward the light-emitting element having the first electrode E1 disposed at one end thereof and made of the magnetic material. Thus, the light-emitting element may be easily aligned with and received in the first debossing groove 142. Further, the light-emitting efficiency of the light-emitting element may be improved due to the inclined side surface of the first debossing groove 142.

In one example, the light-emitting efficiency may be further improved by modifying the structure of the debossing groove. This will be described with reference to the drawings below.

FIG. 18 to FIG. 28 are diagrams illustrating a method for manufacturing a display device according to another aspect of the present disclosure. Components such as transistors disposed in the circuit area CA are the same as those in FIG. 9. Accordingly, components marked with the same reference numerals as in FIG. 9 may be briefly described or omitted.

Figure 18:
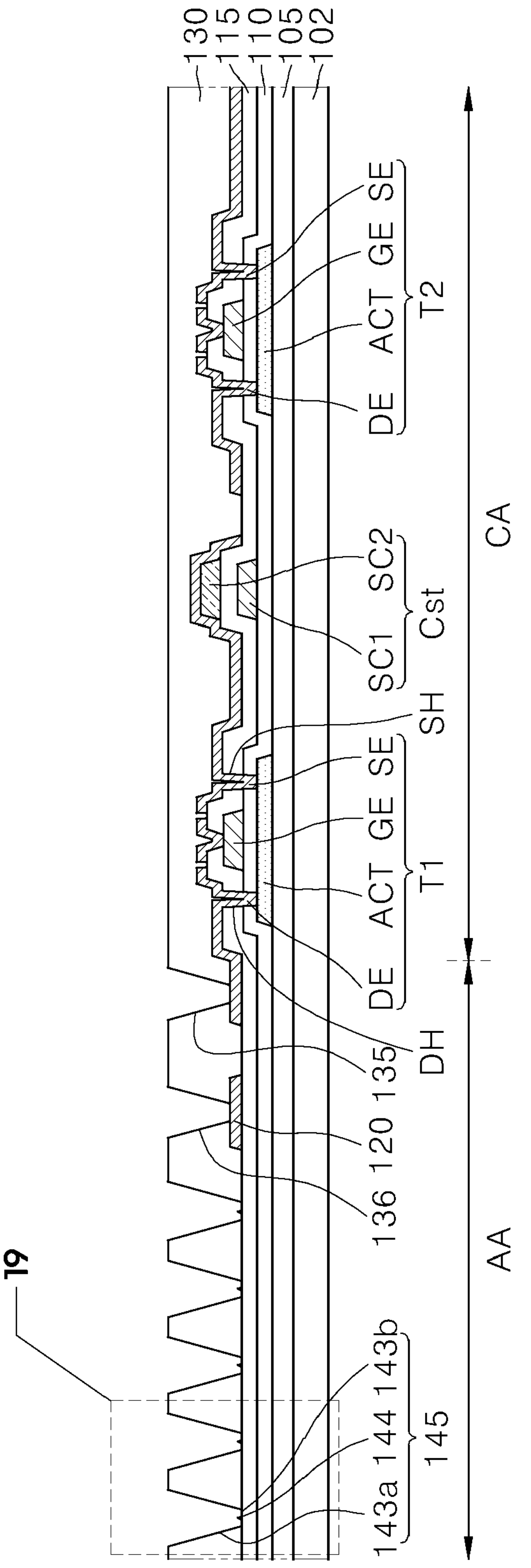
FIGS. 18 to 28 are diagrams illustrating a method for manufacturing a display device according to another aspect of the present disclosure.
Figure 19:
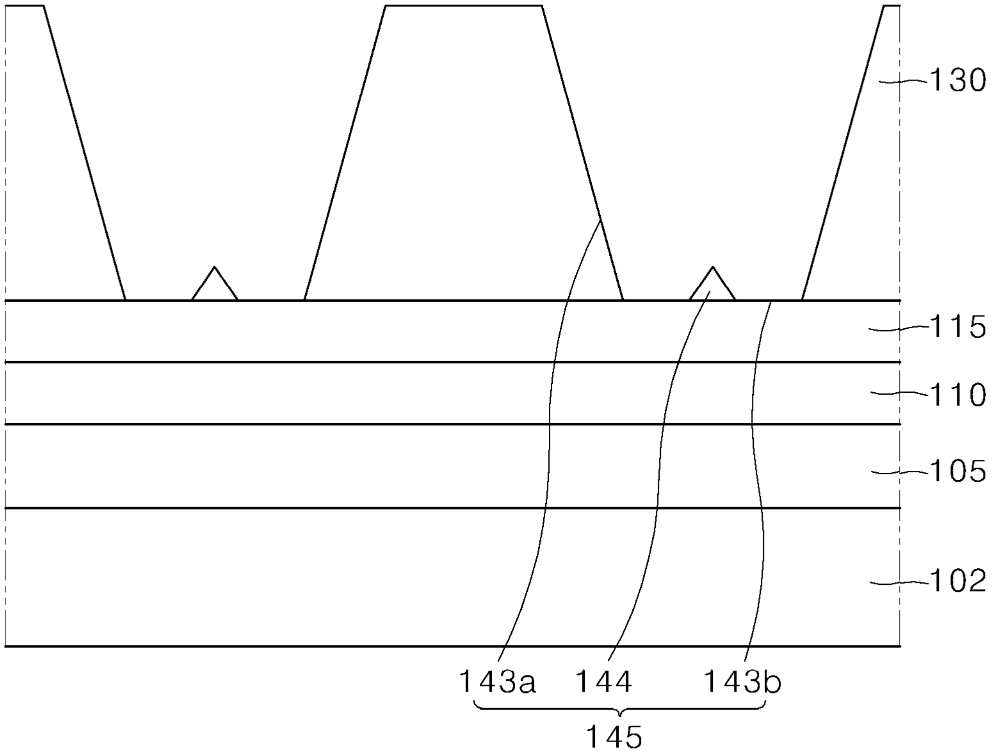

Referring to FIG. 18 and FIG. 19, the base substrate 102 may include the display area AA and the circuit area CA, wherein the circuit area CA may include the driving transistor T1, the switching transistor T2, the storage capacitor Cst, and various lines. A structure in which the buffer layer 105, the first interlayer insulating layer 110, and the second interlayer insulating layer 115 are stacked on the base substrate 102 may be disposed in the display area AA. The lines are not disposed on the display area AA.

The planarization layer 130 having the plurality of second debossing grooves 145 defined therein may be disposed on the second interlayer insulating layer 115. The second debossing groove 145 may include the inclined side surface 143*a*, the bottom surface 143*b*, and the protrusion 144 protruding from the bottom surface 143*b*. The second debossing groove 145 may have a cone-shaped cross-sectional shape in which a width thereof gradually decreases as the groove 145 extends downwardly to the bottom surface 143*b*. The second debossing groove 145 may have a circular shape as shown in FIG. 11 in the top view. The protrusion 144 may be disposed at and on a center of the bottom surface 143*b* of the second debossing groove 145.

The protrusion 144 may have an outer surface area smaller than a cross-sectional area of the light-emitting element ED in a diameter direction, and may have the inclined side surface so that the light-emitting element ED does not contact the protrusion 144.

Figure 20:
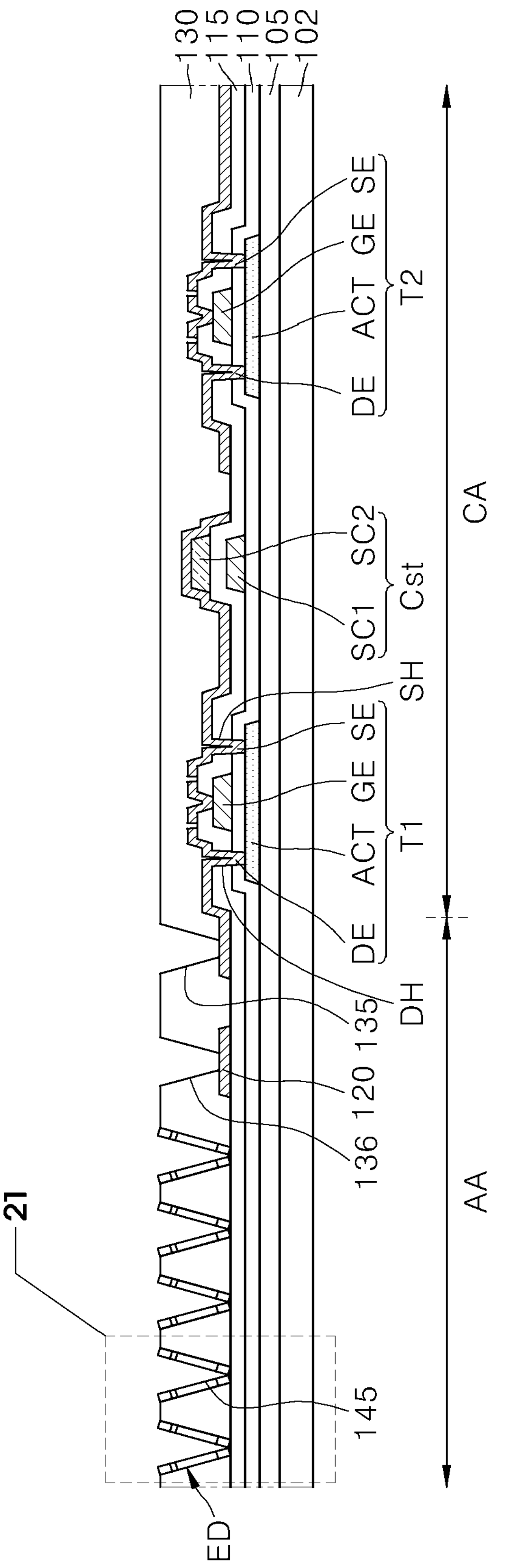
Figure 21:
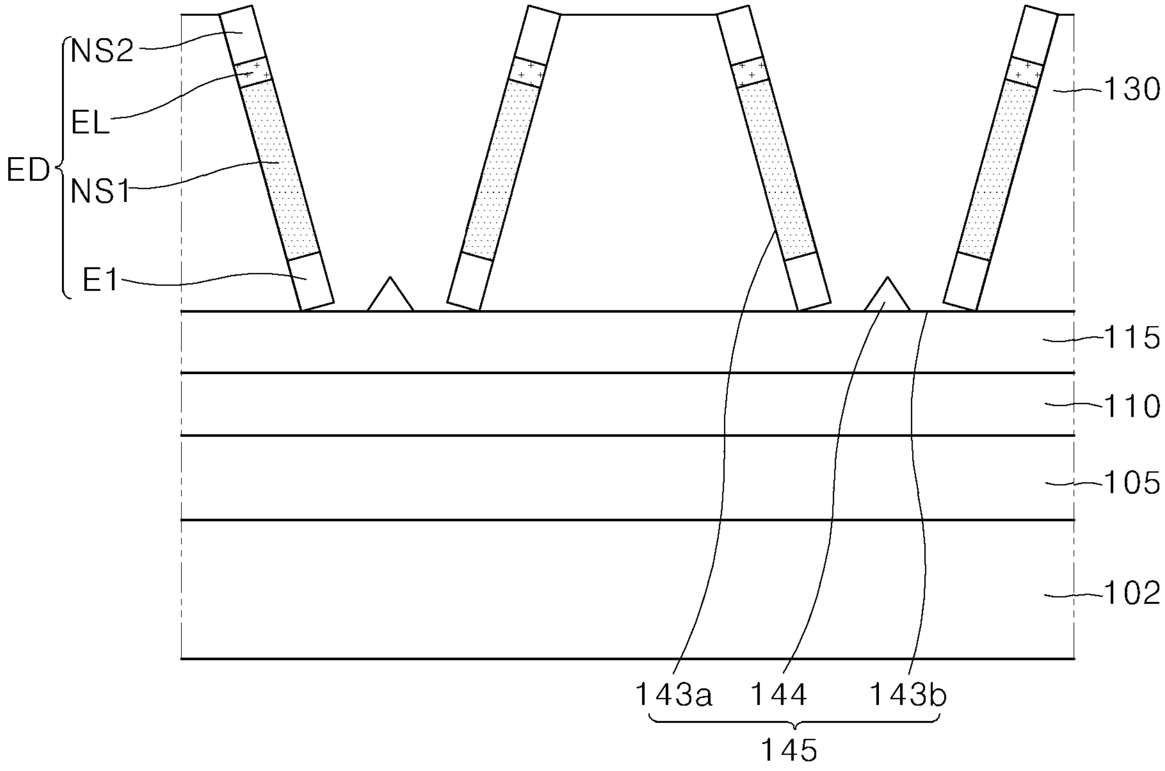
Figure 22:
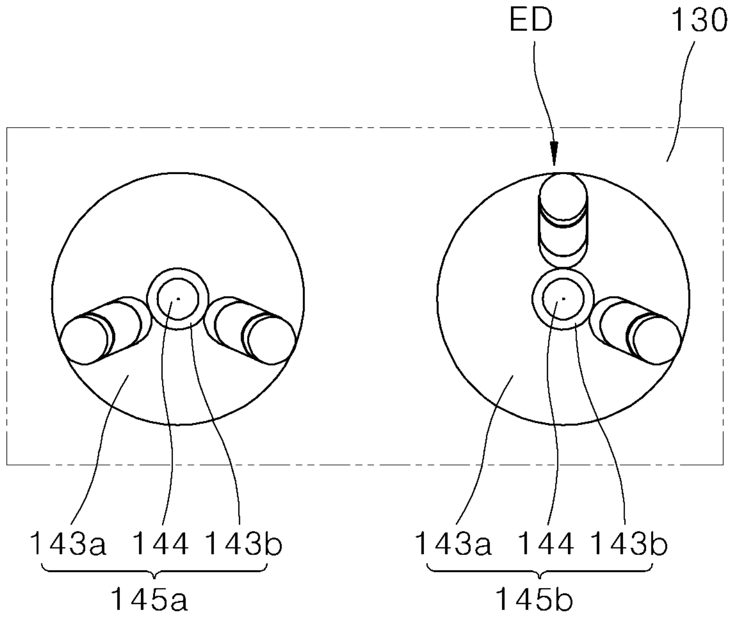

Referring to FIGS. 20, 21 and 22, at least two light-emitting elements ED may be disposed on and in contact with the inclined side surface 143*a* of the second debossing groove 145. At least two light-emitting elements ED may not overlap with each other due to the protrusion 144 disposed on the bottom surface 143*b* of the second debossing groove 145.

Each of at least two light-emitting elements ED disposed in the second debossing groove 145 may be oriented such that the first electrode E1 of each of the light-emitting elements ED made of the magnetic material contacts the bottom surface 143*b*. A position of the nanorod-shaped light-emitting element ED placed in the second debossing groove 145 may be irregular per the second debossing groove 145. In one example, referring to FIG. 22, when two light-emitting elements ED are disposed in one second debossing groove 145 (e.g., 145*a* and 145*b* in FIG. 22), one light-emitting element DE may be placed on and contact the left inclined side surface 143*a* of the second debossing groove 145, while the other light-emitting element DE may be placed on and contact the right inclined side surface 143*a* of the second debossing groove 145. Alternatively, when two light-emitting elements ED are disposed in one second debossing groove 145, the two light-emitting elements ED may be disposed on and contact the inclined side surfaces 143*a* extending in different directions, respectively.

Figure 23:
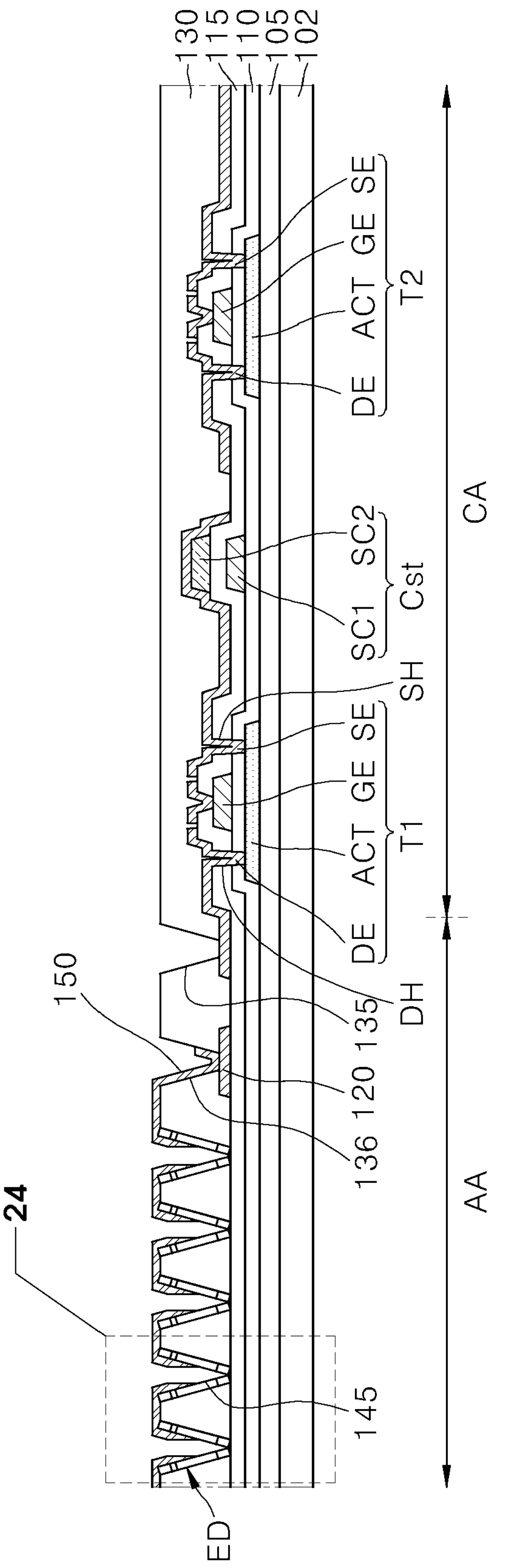
Figure 24:
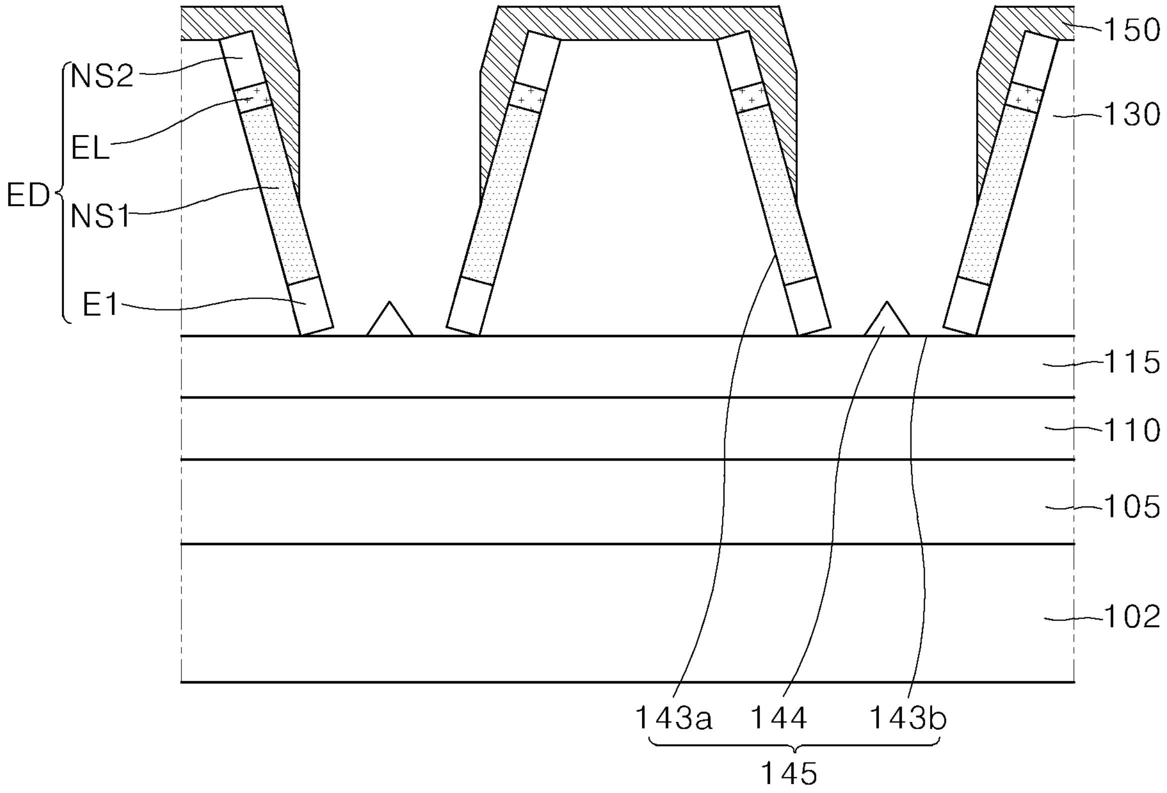
Figure 25:
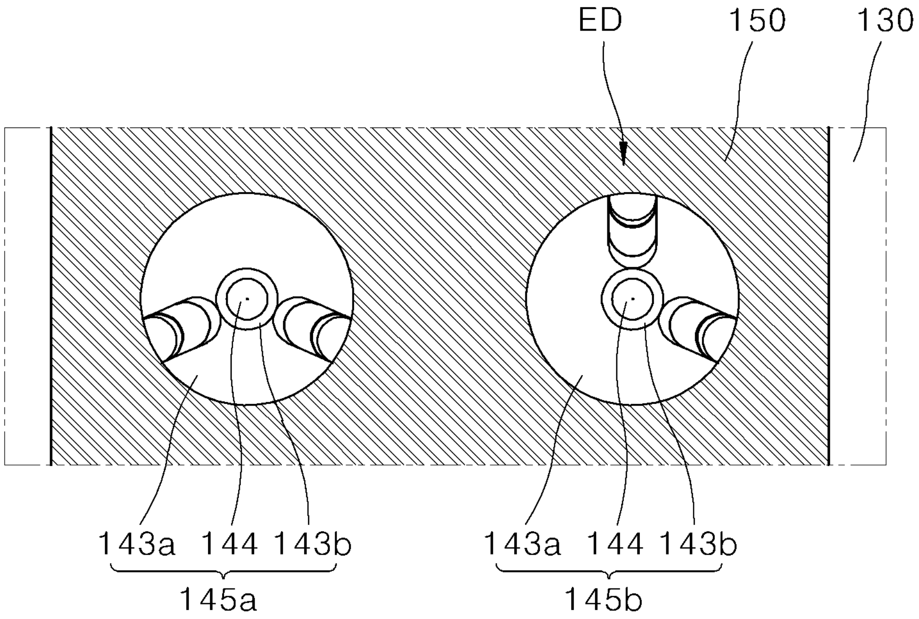

Referring to FIG. 23, FIG. 24 and FIG. 25, the second electrode line 150 may be disposed on a portion of the planarization layer 130 having the plurality of second debossing grooves 145 (e.g., 145*a* and 145*b* in FIG. 25) defined therein in the display area AA. The second electrode line 150 may be disposed in an entirety of the display area AA and may be formed to surround an outer circumferential surface of an upper portion of a portion of the planarization layer 130 disposed between adjacent second debossing grooves 145. The second electrode line 150 may be formed to extend along and on the inclined side surface 143*a*. Accordingly, the second electrode line 150 may contact the second semiconductor layer NS2 of the light-emitting element ED. Further, the second electrode line 150 may contact the top face of the signal line 120 exposed through the opening 136. The second electrode line 150 may include a transparent metal oxide such as indium-tin-oxide (ITO) or indium-zinc-oxide (IZO).

Figure 26:
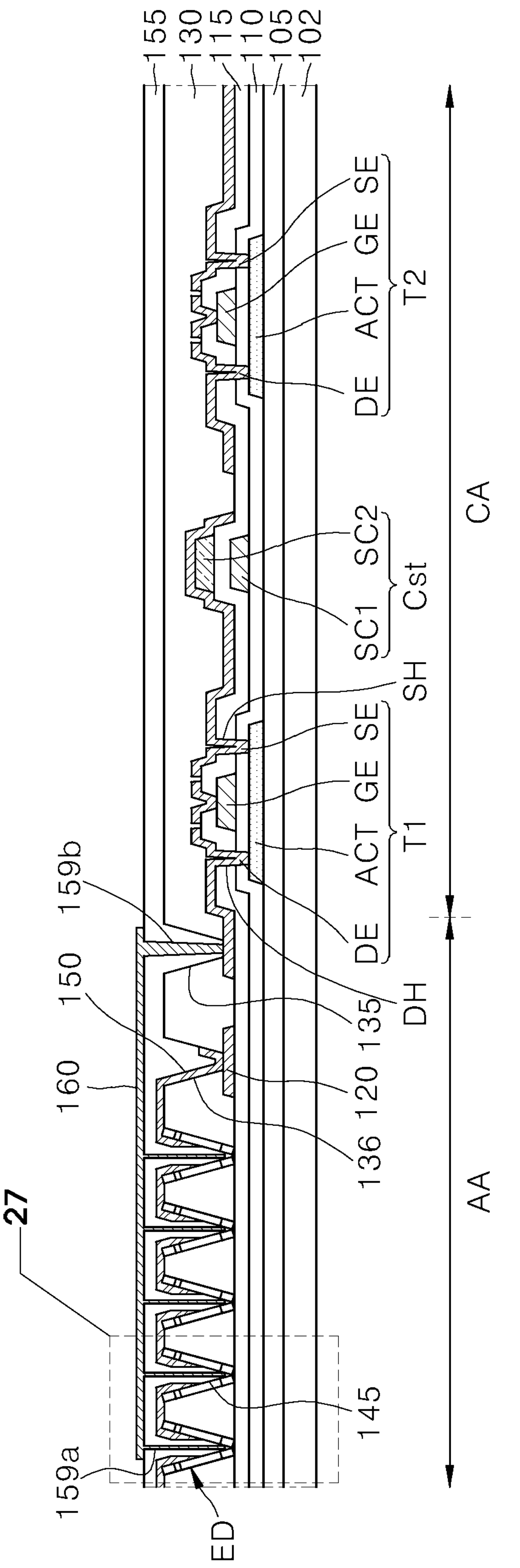
Figure 27:
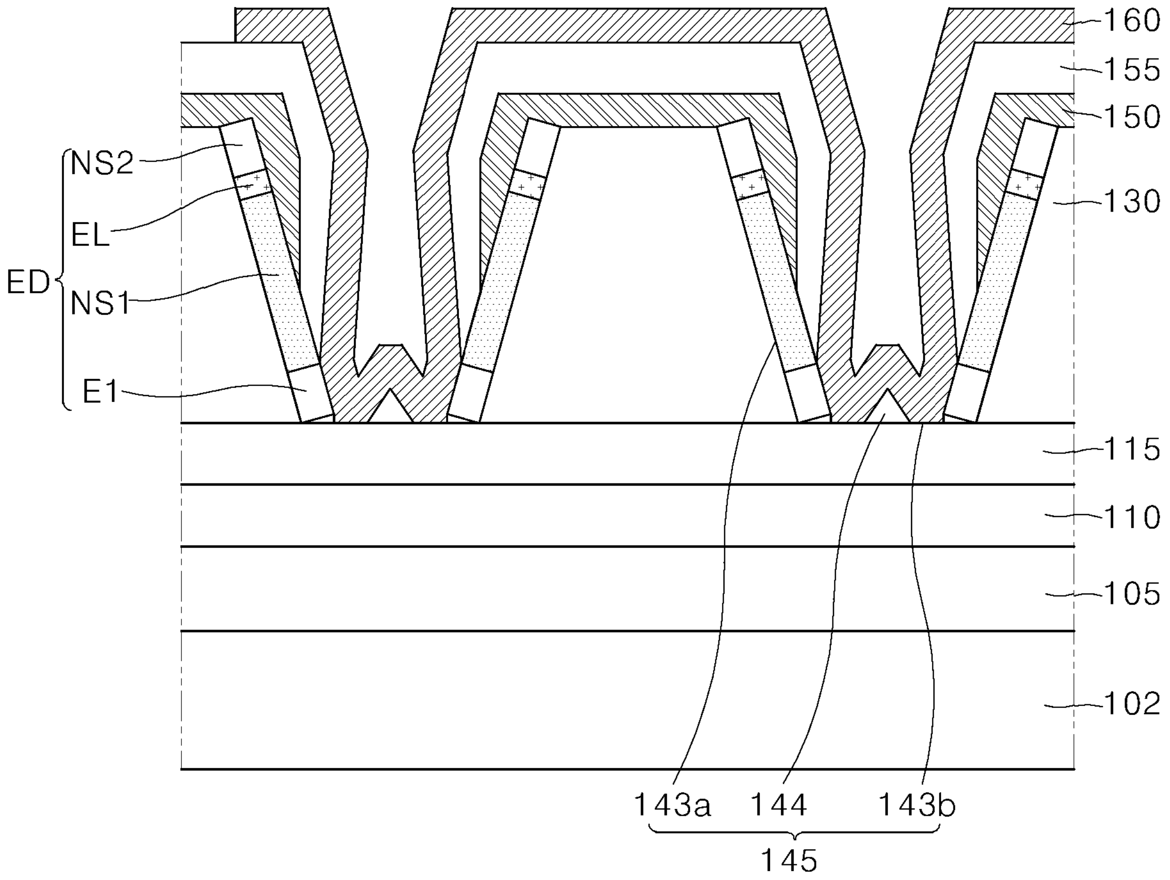
Figure 28:
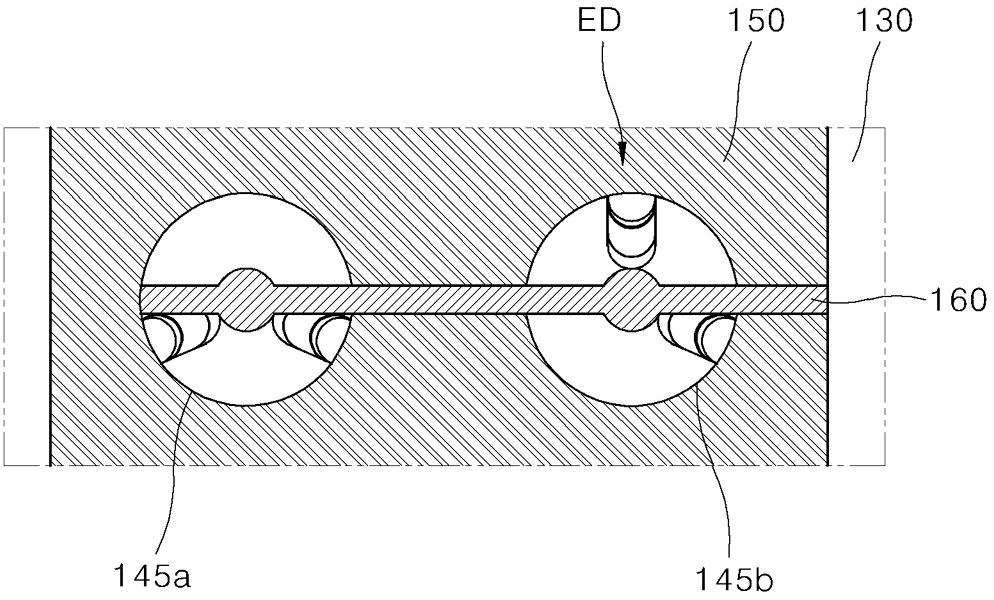

Referring to FIG. 26, FIG. 27, and FIG. 28, the insulating layer 155 may be disposed on the planarization layer 130 in which the plurality of second debossing grooves 145 (e.g., 145*a* and 145*b* in FIG. 28) are defined and on which the second electrode line 150 has been disposed. The insulating layer 155 may have the plurality of contact-holes 159*a* and 159*b* defined therein. The plurality of contact-holes 159*a* and 159*b* may include the first contact-hole 159*a* extending through the insulating layer 155 to expose the first electrode E1 of the light-emitting element ED received in the first debossing groove 142, and a second contact-hole 159*b* extending through the insulating layer 155 to expose a portion of the top surface of the drain electrode DE of the driving transistor T1 of the circuit area CA.

Next, the first electrode line 160 is formed on the insulating layer 155. The first electrode line 160 may fill each of the plurality of contact-holes 159*a* and 159*b*. The first electrode line 160 may contact and be electrically connected to the first electrode E1 of the light-emitting element ED exposed through the first contact-hole 159*a*. Further, the first electrode line 160 may contact and be electrically connected to the portion of the drain electrode DE exposed through the second contact-hole 159*b* and thus may be electrically connected to the driving transistor T1. The first electrode line 160 may include a transparent metal oxide such as indium-tin-oxide (ITO) or indium-zinc-oxide (IZO).

According to another aspect of the present disclosure, the second debossing groove 145 having the cone shape may be defined on the display area of the base substrate 102 and may include the protrusion 144 disposed on the bottom surface 143*b* thereof. Then, the magnetic field is generated in a vertical upwardly direction from a position under the bottom surface of the second debossing groove 145 toward the light-emitting element having the first electrode E1 disposed at one end thereof and made of the magnetic material. Thus, the light-emitting element ED may be easily aligned with and received in the second debossing groove 145. Further, due to the structure in which the protrusion 144 is disposed on the bottom surface 143*b*, at least two or more light-emitting elements ED may be placed in one second debossing groove 145 so as not to overlap with each other. Accordingly, the light-emitting efficiency of the light-emitting element may be improved.

It will be apparent to those skilled in the art that various modifications and variations can be made in the display device and the method for manufacturing the same of the present disclosure without departing from the spirit or scope of the aspects. Thus, it is intended that the present disclosure covers the modifications and variations of the aspects provided they come within the scope of the appended claims and their equivalents.

What is claimed is:

1. A display device comprising:

a base substrate including a display area and a circuit area;

a planarization layer disposed on the base substrate;

a plurality of debossing grooves defined in the planarization layer and disposed on the display area of the base substrate;

at least one light-emitting element aligned with and disposed in the plurality of debossing grooves, each of the at least one light-emitting element including a first semiconductor layer, an active layer, a second semiconductor layer, and a first electrode contacting the first semiconductor layer;

a second electrode line electrically connected to the second semiconductor layer of the light-emitting element; and a first electrode line electrically connected to the first electrode of the light-emitting element, wherein the first electrode includes a magnetic material, and wherein each of the plurality of debossing grooves includes an inclined side surface inclined with respect to an upper surface of the planarization layer.

2. The display device of claim 1, further comprising an insulating layer disposed between the first electrode line and the second electrode line.

3. The display device of claim 2, wherein the first electrode line covers the planarization layer and contacts the first electrode of the light-emitting element.

4. The display device of claim 1, wherein the second electrode line covers a top surface of the planarization layer between adjacent debossing grooves and a part of side surface of at least one of the plurality of debossing grooves while contacting the second semiconductor layer.

5. The display device of claim 1, further comprising a multi-layer insulating structure disposed under the plurality of debossing grooves and disposed in the display area.

6. The display device of claim 1, wherein the light-emitting element includes a nanorod shape.

7. The display device of claim 6, wherein each of the plurality of debossing grooves includes a flat bottom surface and the inclined side surface inclined with respect to the bottom surface.

8. The display device of claim 7, wherein a length of the inclined side surface is smaller than or equal to a length of the light-emitting element.

9. The display device of claim 7, wherein the first electrode of each light-emitting element of the at least one of light-emitting element is in contact with the bottom surface of a debossing groove receiving the light-emitting element of the plurality of debossing grooves.

10. The display device of claim 6, wherein each of the plurality of debossing grooves includes a flat bottom surface, a protrusion protruding from the bottom surface, and the inclined side surface inclined with respect to the bottom surface.

11. The display device of claim 10, wherein the protrusion has an outer surface area smaller than a cross-sectional area of the light-emitting element in a diameter direction, wherein the protrusion has an inclined side surface.

12. The display device of claim 1, wherein a driving transistor and a storage capacitor for driving the light-emitting element are disposed in the circuit area.

13. The display device of claim 1, wherein at least one of the first electrode line and the second electrode line includes a transparent metal oxide including indium-tin-oxide (ITO) or indium-zinc-oxide (IZO).

14. The display device of claim 1, wherein at least two light-emitting elements, which do not overlap with each other, are received in each of the plurality of debossing grooves.

* * * * *